(12) United States Patent
Lu et al.

(10) Patent No.: US 12,256,578 B2
(45) Date of Patent: Mar. 18, 2025

(54) OPTICAL SENSING APPARATUS

(71) Applicant: ARTILUX, INC., Menlo Park, CA (US)

(72) Inventors: Yen-Cheng Lu, Hsinchu County (TW); Yu-Hsuan Liu, Hsinchu County (TW); Jung-Chin Chiang, Chiang (TW); Yun-Chung Na, San Jose, CA (US); Tsung-Ting Wu, Hsinchu County (TW); Zheng-Shun Liu, Hsinchu County (TW); Chou-Yun Hsu, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 18/905,089

(22) Filed: Oct. 2, 2024

(65) Prior Publication Data

US 2025/0031466 A1  Jan. 23, 2025

Related U.S. Application Data

(63) Continuation of application No. 18/222,261, filed on Jul. 14, 2023, which is a continuation-in-part of application No. 17/729,393, filed on Apr. 26, 2022.
(Continued)

(51) Int. Cl.
*H10F 30/225* (2025.01)
*H10F 39/00* (2025.01)
(Continued)

(52) U.S. Cl.
CPC ....... *H10F 77/334* (2025.01); *H10F 30/2255* (2025.01); *H10F 39/8033* (2025.01); *H10F 77/14* (2025.01)

(58) Field of Classification Search
CPC ......... H01L 27/1461; H01L 31/035272; H01L 31/1075; H10F 30/2255; H10F 39/8033; H10F 77/14
See application file for complete search history.

(56) References Cited

U.S. PATENT DOCUMENTS 7,348,608 B2  3/2008  Ko et al.
7,741,657 B2  6/2010  Pauchard et al.
(Continued)

FOREIGN PATENT DOCUMENTS

CN  110797431  2/2020
EP  3971996  3/2022
(Continued)

OTHER PUBLICATIONS

Ceccarelli et al., "Recent Advances and Future Perspectives of Single-Photon Avalanche Diodes for Quantum Photonics Applications," CoRR, submitted on Oct. 12, 2020, arXiv:2010.05613v1, 39 pages.
(Continued)

*Primary Examiner* — Herve-Louis Y Assouman
*Assistant Examiner* — Christopher M Roland
(74) *Attorney, Agent, or Firm* — Fish & Richardson P.C.

(57) ABSTRACT

An optical sensing apparatus including: a substrate including a first material; an absorption region including a second material different from the first material; an amplification region formed in the substrate and configured to collect at least a portion of the photo-carriers from the absorption region and to amplify the portion of the photo-carriers; an interface-dopant region formed in the substrate between the absorption region and the amplification region; a buffer layer formed between the absorption region and the interface-dopant region; one or more field-control regions formed between the absorption region and the interface-dopant
(Continued)

region and at least partially surrounding the buffer layer; and a buried-dopant region formed in the substrate and separated from the absorption region, where the buried-dopant region is configured to collect at least a portion of the amplified portion of the photo-carriers from the amplification region.

19 Claims, 19 Drawing Sheets

Related U.S. Application Data

(60) Provisional application No. 63/385,212, filed on Nov. 29, 2022, provisional application No. 63/403,795, filed on Sep. 5, 2022, provisional application No. 63/183,664, filed on May 4, 2021.

(51) Int. Cl.
  *H10F 77/14* (2025.01)
  *H10F 77/30* (2025.01)

(56) References Cited

U.S. PATENT DOCUMENTS

| | | |
|---|---|---|
| 8,704,272 B2 | 4/2014 | Huang et al. |
| 9,755,096 B2 | 9/2017 | Novack et al. |
| 2005/0167709 A1 | 8/2005 | Augusto |
| 2008/0017883 A1 | 1/2008 | Sarid et al. |
| 2009/0101919 A1 | 4/2009 | Yao |
| 2011/0012221 A1 | 1/2011 | Fujikata et al. |
| 2012/0043637 A1 | 2/2012 | King et al. |
| 2012/0326259 A1 | 12/2012 | Huang et al. |
| 2014/0252528 A1 | 9/2014 | Yasuoka et al. |
| 2014/0291682 A1 | 10/2014 | Huang et al. |
| 2015/0028443 A1 | 1/2015 | Shi et al. |
| 2015/0097256 A1 | 4/2015 | Ang et al. |
| 2016/0172525 A1 | 6/2016 | Huang et al. |
| 2020/0203544 A1 | 6/2020 | Takemura et al. |
| 2020/0203547 A1 | 6/2020 | Benhammou et al. |
| 2021/0066528 A1 | 3/2021 | Nada et al. |
| 2021/0066529 A1 | 3/2021 | Lu et al. |
| 2022/0069153 A1 | 3/2022 | Li et al. |
| 2022/0359770 A1 | 11/2022 | Lu et al. |
| 2023/0369518 A1 | 11/2023 | Lu et al. |

FOREIGN PATENT DOCUMENTS

| | | |
|---|---|---|
| TW | 202013698 | 4/2020 |
| WO | WO 2019/241450 | 12/2019 |

OTHER PUBLICATIONS

EP Extended Search Report in European Appln. No. 22171581.6, dated Sep. 26, 2022, 5 pages.
EP Extended Search Report in European Appln. No. 23198625.8, dated Oct. 12, 2023, 7 pages.
Office Action in Taiwanese Appln. No. 11320206100, dated Mar. 1, 2024, 16 pages (with machine translation).

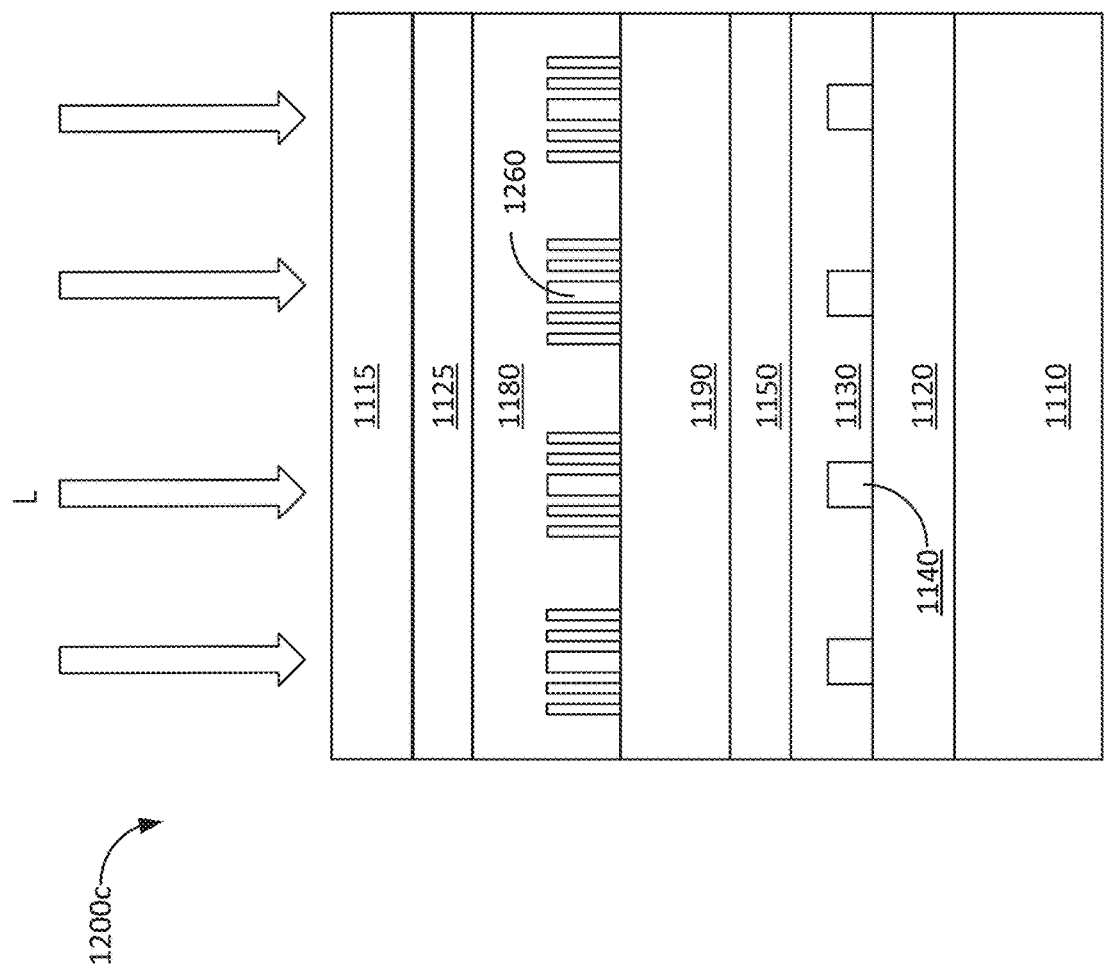

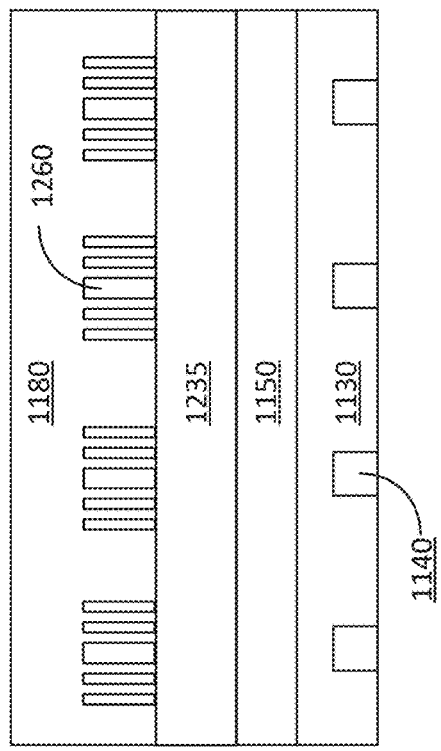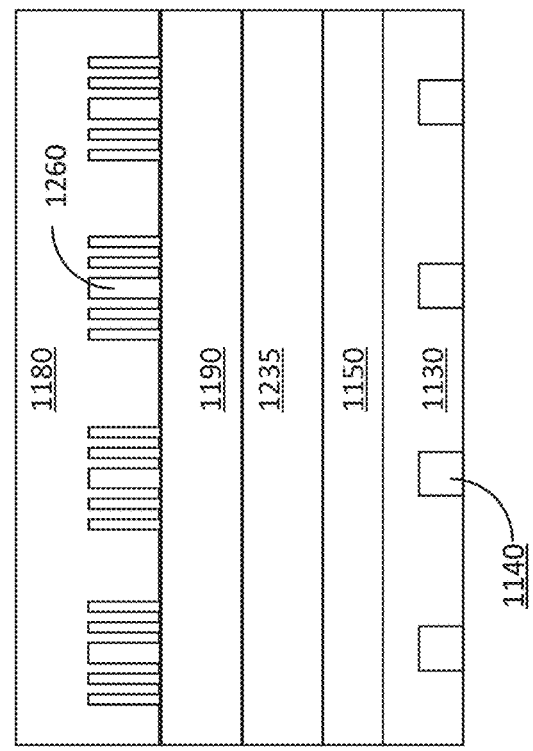

OPTICAL SENSING APPARATUS

CROSS-REFERENCE TO RELATED APPLICATIONS

This application is a continuation of U.S. patent application Ser. No. 18/222,261, titled "OPTICAL SENSING APPARATUS", filed Jul. 14, 2023, which is a continuation-in-part application of U.S. patent application Ser. No. 17/729,393, titled "OPTICAL SENSING APPARATUS", filed Apr. 26, 2022. This application also claims the benefit of U.S. Provisional Patent Application No. 63/183,664, filed May 4, 2021, U.S. Provisional Patent Application No. 63/403,795, filed Sep. 5, 2022, and U.S. Provisional Patent Application No. 63/385,212, filed Nov. 29, 2022; all of which are incorporated by reference herein in their entireties.

BACKGROUND

1. Technical Field

This application relates to a sensor, and more particularly, to an optical sensor

2. Background

Sensors are being used in many applications, such as smartphones, robotics, autonomous vehicles, proximity sensing, biometric sensing, image sensors, high-speed optical receiver, data communications, direct/indirect time-of-flight (TOF) ranging or imaging sensors, medical devices, etc. for object recognition, image enhancement, material recognition, and other relevant applications.

SUMMARY

The present disclosure describes systems, devices, apparatus, methods, and techniques for optical sensing.

One aspect of the present disclosure features an optical sensing apparatus, including a substrate including a first material; an absorption region including a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; a buried-dopant region formed in the substrate and separated from the absorption region, where the buried-dopant region is configured to collect at least a portion of the amplified portion of the photo-carriers from the amplification region; and a buffer layer formed between the buried-dopant region and the absorption region, where the buffer layer is intrinsic and has a thickness not less than 50 nm.

Another aspect of the present disclosure features an optical sensing apparatus including: a substrate including a first material; an absorption region including a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; a buried-dopant region of a first conductivity type, formed in the substrate and separated from the absorption region, where the buried-dopant region is configured to collect at least a portion of the amplified portion of the photo-carriers from the amplification region; a cladding layer formed over the absorption region; one or more first contacts formed on the cladding layer and electrically coupled to the buried-dopant region, the one or more first contacts configured to provide at least a portion of the photo-carriers from the buried-dopant region as a readout signal; and one or more first conductive regions formed in the substrate and coupled to the buried-dopant region, where the one or more first conductive regions are of the first conductivity type and doped with a dopant having a peak doping concentration not less than about $5\times10^{18}$ $cm^{-3}$.

Another aspect of the present disclosure features an optical sensing apparatus including: a substrate including a first material; an absorption region including a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; a buried-dopant region of a first conductivity type, formed in the substrate and separated from the absorption region, where the buried-dopant region is configured to collect at least a portion of the amplified portion of the photo-carriers from the amplification region, and where the buried-dopant region includes: one or more first buried-dopant regions having a first peak doping concentration; one or more second buried-dopant regions surrounding the one or more first buried-dopant regions and having a second peak doping concentration; and one or more first doped guard-rings having a third peak doping concentration and formed between the one or more first buried-dopant regions and the one or more second buried-dopant regions, where the third peak doping concentration is lower than the first peak doping concentration.

Another aspect of the present disclosure features an optical sensing apparatus including: a substrate including a first material; an absorption region including a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; an interface-dopant region formed in the substrate and adjacent to the absorption region, where the interface-dopant region includes one or more first interface-dopant regions, one or more second interface-dopant regions surrounding the one or more first interface-dopant regions, and one or more doped guard-rings surrounding the one or more second interface-dopant regions. In some embodiments, where a peak doping concentration of the one or more doped guard-rings is lower than a peak doping concentration of the one or more second interface-dopant regions.

In some embodiments, the substrate includes a first interface and a second interface opposite to the first interface, where the substrate is substantially devoid of metal material between the first interface and the second interface.

Another example aspect of the present disclosure is directed to an optical sensing apparatus. The optical sensing apparatus includes a substrate including a first material. The optical sensing apparatus further includes an absorption region including a second material, the absorption region configured to receive an optical signal and generate photo-carriers in response to receiving the optical signal. The optical sensing apparatus further includes one or more punch-through regions formed in the substrate and under the absorption region, the one or more punch-through regions configured to collect at least a portion of the photo-carriers from the absorption region. The optical sensing apparatus further includes one or more blocking regions formed around the one or more punch-through regions, the one or more blocking regions configured to block at least a portion of the photo-carriers so as to guide the portion of the photo-carriers to enter the one or more punch-through region. The optical sensing apparatus further includes a buried-dopant region formed in the substrate and under the one or more punch-through regions and the one or more blocking regions, the buried-dopant region configured to collect at least a portion of the photo-carriers from the one or more punch-through regions. The optical sensing apparatus further includes a cladding layer formed over the absorption region. The optical sensing apparatus further includes one or more first contacts formed on the cladding layer and electrically coupled to the buried-dopant region, the one or more first contacts configured to provide at least a portion of the photo-carriers from the buried-dopant region as a readout signal.

In some embodiments, the absorption region has a gradient doping profile.

In some embodiments, the optical sensing apparatus further includes a doped contact region formed between the absorption region and the cladding layer, where the doped contact region is configured to collect photo-carriers of a first type. The optical sensing apparatus further includes one or more second contacts formed on the cladding layer and electrically coupled to the doped contact region, where the buried-dopant region is configured to collect photo-carriers of a second type.

In some embodiments, the optical sensing apparatus further includes one or more first conductive regions formed in the substrate and coupled to the buried-dopant region. The optical sensing apparatus further includes one or more second conductive regions formed in the cladding, where each one of the one or more second conductive regions is coupled to (i) a respective one of the first contacts, and (i) a respective one of the one or more first conductive regions.

In some embodiments, the substrate further includes an insulating layer formed under the buried-dopant region.

In some embodiments, where the buried-dopant region further includes one or more first buried-dopant regions having a first doping concentration and a first depth, where the one or more first buried-dopant regions are coupled to the one or more punch-through regions. The buried-dopant region further includes one or more second buried-dopant regions having a second doping concentration and a second depth, where the one or more second buried-dopant regions are coupled to the one or more blocking regions, where at least one or more of (i) the second doping concentration is lower than the first doping concentration, or (ii) the second depth is shallower than the first depth. The optical sensing apparatus further includes an interface-dopant region formed in the substrate and between the absorption region and the buried-dopant region.

In some embodiments, the one or more punch-through regions are configured to amplify photo-carriers collected from the absorption region, and the buried-dopant region and the interface-dopant region are arranged such that a first break-down voltage associated with the one or more punch-through regions is lower than a second break-down voltage associated with the one or more blocking regions.

In some embodiments, the optical sensing apparatus is an avalanche photodiode or a single-photon avalanche diode.

In some embodiments, the buried-dopant region further includes one or more first doped guard-rings having a fifth doping concentration, the one or more first doped guard-rings surrounding the one or more first buried-dopant regions, where the fifth doping concentration is lower than the first doping concentration, where the one or more first doped guard-rings are configured to adjust an electric field associated with edges or corners of the one or more punch-through regions.

In some embodiments, the interface-dopant region further includes one or more first interface-dopant regions having a third doping concentration and a third depth, where the one or more first interface-dopant regions are coupled to the one or more punch-through regions. The interface-dopant region further includes one or more second interface-dopant regions having a fourth doping concentration and a fourth depth, where the one or more second interface-dopant regions are coupled to the one or more blocking regions, where at least one or more of (i) the fourth doping concentration is higher than the third doping concentration, or (ii) the fourth depth is shallower than the third depth In some embodiments, the interface-dopant region further includes one or more second doped guard-rings having a sixth doping concentration, the one or more second doped guard-rings surrounding the one or more second interface-dopant regions, where the sixth doping concentration is lower than the fourth doping concentration, and where the one or more second doped guard-rings are configured to adjust an electric field associated with edges or corners of the one or more blocking regions.

In some embodiments, the absorption region is partially formed or wholly formed in the substrate.

In some embodiments, the optical sensing apparatus further includes one or more sidewall-dopant regions surrounding the absorption region.

In some embodiments, the first material includes silicon, and where the second material includes germanium.

In some embodiments, the one or more punch-through regions include multiple punch-through regions. The one or more blocking regions include multiple blocking regions, and the multiple punch-through regions are separated by the multiple blocking regions.

In some embodiments, the absorption region is p-doped, and where the buried-dopant region is n-doped.

Another aspect of the present disclosure features a sensing module, including a transmitter unit, a receiver unit, a signal processor in electrical communication with the receiver unit; and a controller in electrical communication with the processor and the transmitter unit; where the receiver unit includes one or more optical sensing apparatus as described in the present disclosure. In some embodiments, the sensing module can be a proximity sensing module or a TOF sensing module including i-TOF and d-TOF.

Another example aspect of the present disclosure is directed to an optical sensing apparatus. The optical sensing apparatus include a substrate comprising a first material; an absorption region comprising a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; an interface-dopant region formed in the substrate between the absorption region and the amplification region; a buffer layer formed between the absorption region and the interface-dopant region; one or more field-control regions formed between the absorption region and the interface-dopant region and at least partially surrounding the buffer layer, where one or more properties of the one or more field-control regions are different from corresponding one or more properties of the buffer layer; and a buried-dopant region formed in the substrate and separated from the absorption region, where the buried-dopant region is configured to collect at least a portion of the amplified portion of the photo-carriers from the amplification region.

In some embodiments, the one or more properties of the one or more field-control regions are different from the corresponding one or more properties of the buffer layer so as to form, under a reverse bias breakdown voltage, one or more punch-through regions and one or more blocking regions in the amplification region, where the one or more blocking regions are adjacent to the one or more field-control regions and the one or more punch-through regions are adjacent to the buffer layer.

In some embodiments, the one or more properties of the one or more field-control regions include a peak dopant concentration or a dopant depth. In some embodiments, the one or more properties of the buffer layer include a peak dopant concentration or a dopant depth. In some embodiments, a peak dopant concentration of the one or more field-control regions is higher than a peak dopant concentration of the buffer layer. In some embodiments, a dopant depth of the one or more field-control regions is deeper than a dopant depth of the buffer layer.

In some embodiments, the absorption region includes a p-doped region, the interface-dopant region is p-doped, the one or more field-control regions are p-doped, and the buried-dopant region is n-doped.

In some embodiments, the interface-dopant region further includes one or more first interface-dopant regions and one or more second interface-dopant regions at least partially surrounding the one or more first interface-dopant regions, where a peak dopant concentration of the one or more first interface-dopant regions is lower than a peak dopant of the one or more second interface-dopant regions, or a dopant depth of the one or more first interface-dopant regions is deeper than a dopant depth of the one or more second interface-dopant regions.

In some embodiments, the buried-dopant region further includes one or more first buried-dopant regions and one or more second buried-dopant regions at least partially surrounding the one or more first buried-dopant regions, where a peak dopant concentration of the one or more first buried-dopant regions is higher than a peak dopant of the one or more second buried-dopant regions, or a dopant depth of the one or more first buried-dopant regions is deeper than a dopant depth of the one or more second buried-dopant regions.

In some embodiments, the optical sensing apparatus further includes one or more sidewall-dopant regions surrounding the absorption region. In some embodiments, the absorption region has a gradient doping profile. In some embodiments, the first material comprises silicon and the second material comprises germanium. In some embodiments, the absorption region is at least partially embedded in the substrate. In some embodiments, the absorption region is formed over a surface of the substrate. In some embodiments, the buffer layer has a thickness not less than 50 nm.

In some embodiments, the optical sensing apparatus comprises one or more pixels supported by the substrate, where each of the pixel comprises a corresponding absorption region supported by the substrate; one or more lenses over the respective pixel of the one or more pixels, where the one or more lenses are composed of a first material having a first refractive index; an encapsulation layer over the one or more lenses and composed of a second material having a second refractive index between 1.3 to 1.8, where a difference between the first refractive index and the second refractive index is above an index threshold such that a difference between an effective focal length of the one or more lenses and a distance between the one or more lenses and the one or more pixels is within a distance threshold.

In some embodiments, the one or more lenses can be metalenses. The one or more metalenses can be composed of a material comprising Si, $Si_xO_y$, $Si_xN_y$, $Si_xO_yN_z$, $Nb_2O_5$, a-Si:H, $TiO_2$, $Ta_2O_5$, ITO, Ag, Nb, or Cr, where $0 \leq x \leq 1$, $0 \leq y \leq 1$, $0 \leq z \leq 1$.

In some embodiments, the first refractive index of the one or more lenses is not less than 3, and where the difference between the first refractive index and the second refractive index of the encapsulation layer is not less than 0.5.

In some embodiments, the optical sensing apparatus further comprises a first planarization layer between the encapsulation layer and the one or more lenses, where the first planarization layer is composed of a third material having a third refractive index that is within a threshold from the second refractive index. In some embodiment, the optical sensing apparatus further comprises a first anti-reflection layer between the one or more lenses and the first planarization layer, where the first anti-reflection layer is composed of a fourth material having a fourth refractive index between the third refractive index of the first planarization layer and the first refractive index of the one or more lenses. In some embodiments, the optical sensing apparatus further comprises a filter layer between the first planarization layer and the encapsulation layer, where the filter layer is configured to pass optical signal having a specific wavelength range. In some embodiments, the optical sensing apparatus further comprises a second planarization layer between the one or more lenses and the substrate.

In some embodiments, the first planarization layer or the second planarization layer is composed of a material comprising polymer having a refractive index between 1 and 2. In some embodiments, the optical sensing apparatus further comprises a second anti-reflection layer between the first planarization layer and the encapsulation layer, where the second anti-reflection layer is composed of a sixth material having a sixth refractive index between the second refractive index of the encapsulation layer and the third refractive index of the first planarization layer.

In some embodiments, the optical sensing apparatus further comprises a filter layer between the one or more lenses and the one or more pixels, where the filter layer is configured to pass optical signal having a specific wavelength range. In some embodiments, the optical sensing apparatus further comprises a second planarization layer between the filter layer and the substrate. In some embodiments, the optical sensing apparatus further comprises a carrier substrate and an integrated circuit layer between the one or more pixels and the carrier substrate, where the integrated circuit layer comprises a control circuit configured to control the one or more pixels.

In some embodiments, the optical sensing apparatus comprises one or more pixels supported by the substrate, where each of the pixel comprises a corresponding absorption region supported by the substrate; one or more lenses over the respective pixel of the one or more pixels, where the one or more lenses are composed of a first material having a first refractive index; an encapsulation layer over the one or more lenses and composed of a second material having a second refractive index lower than the first refractive index; and a first planarization layer between the encapsulation layer and the one or more lenses and composed of a third material having a third refractive index that is within a threshold from the second refractive index.

In some embodiments, the optical sensing apparatus further comprises a first anti-reflection layer between the one or more lenses and the encapsulation layer, where the first anti-reflection layer is composed of a fourth material having a fourth refractive index between the third refractive index of the first planarization layer and the first refractive index of the one or more lenses. In some embodiments, the optical sensing apparatus further comprises a filter layer between the first planarization layer and the encapsulation layer, where the filter layer is configured to pass optical signal having a specific wavelength range. In some embodiments, the first planarization layer or the second planarization layer is composed of a material comprising polymer having a refractive index between 1 and 2. In some embodiments, the optical sensing apparatus further comprises a second planarization layer between the one or more lenses and the substrate.

In some embodiments, the optical sensing apparatus further comprises a second anti-reflection layer between the first planarization layer and the encapsulation layer, where the second anti-reflection layer is composed of a sixth material having a sixth refractive index between the second refractive index of the encapsulation layer and the third refractive index of the first planarization layer.

In some embodiments, the optical sensing apparatus further comprises a filter layer between the one or more lenses and the one or more pixels, where the filter layer is configured to pass optical signal having a specific wavelength range. In some embodiments, the optical sensing apparatus further comprises a second planarization layer between the filter layer and the substrate. In some embodiments, the optical sensing apparatus further comprises a carrier substrate and an integrated circuit layer between the one or more pixels and the carrier substrate, where the integrated circuit layer comprises a control circuit configured to control the one or more pixels.

In some embodiments, the first refractive index of the one or more lenses is not less than 3. In some embodiments, a difference between the first refractive index of the one or more lenses and the second refractive index of the encapsulation layer is not less than 0.5. In some embodiments, a difference between the third refractive index of the first planarization layer and the first refractive index of the one or more lenses is not less than 0.5.

In some embodiments, the optical sensing apparatus further comprises one or more pixels supported by the substrate, where each of the pixel comprises a corresponding absorption region supported by the substrate; one or more lenses over the respective pixel of the one or more pixels, where the one or more lenses are composed of a first material having a first refractive index; a first planarization layer over the one or more lenses and composed of a second material having a second refractive index; where a difference between the second refractive index and the first refractive index is not less than 0.5.

In some embodiments, the optical sensing apparatus further comprises one or more pixels supported by the substrate, where each of the pixel comprises a corresponding absorption region supported by the substrate; one or more lenses over the respective pixel of the one or more pixels, where the one or more lenses are composed of a first material having a first refractive index; a layer directly formed over the one or more lenses and composed of a second material having a second refractive index, where a difference between the second refractive index and the first refractive index is not less than 0.5.

Another example aspect of the present disclosure is directed to an optical sensing apparatus including a substrate comprising a first material; an absorption region comprising a second material different from the first material, the absorption region configured to receive an optical signal and generate photo-carriers in response to receiving the optical signal; an amplification region formed in the substrate configured to collect at least a portion of the photo-carriers from the absorption region and to amplify the portion of the photo-carriers; multiple interface-dopant regions formed in the substrate between the absorption region and the amplification region, where a distance between any two interface-dopant regions of the multiple interface-dopant regions is below a threshold value; and a buried-dopant region formed in the substrate and separated from the absorption region, where the buried-dopant region is configured to collect at least a portion of the amplified portion of the photo-carriers from the amplification region.

The details of one or more disclosed implementations are set forth in the accompanying drawings and the description below. Other features, aspects, and advantages will become apparent from the description, the drawings and the claims.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings:

FIGS. 11A-11E and 12A-12E illustrate cross-sectional views of an optical sensing apparatus, according to some embodiments.

Like reference numbers and designations in the various drawings indicate like elements.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material region is without intentionally adding dopants, or contains much lower dopant concentration compared to the dopant concentrations in the doping regions surrounding the semiconductor material region.

Referring to FIG. 1A to FIG. 8B, the present disclosure provides an optical sensing apparatus 100a, 100b, 200a, 200b, 300a, 300b, 400a, 400b, 500a, 500b, 600a, 600b, 700a, 700b, 800a, 800b.

Figure 1A:
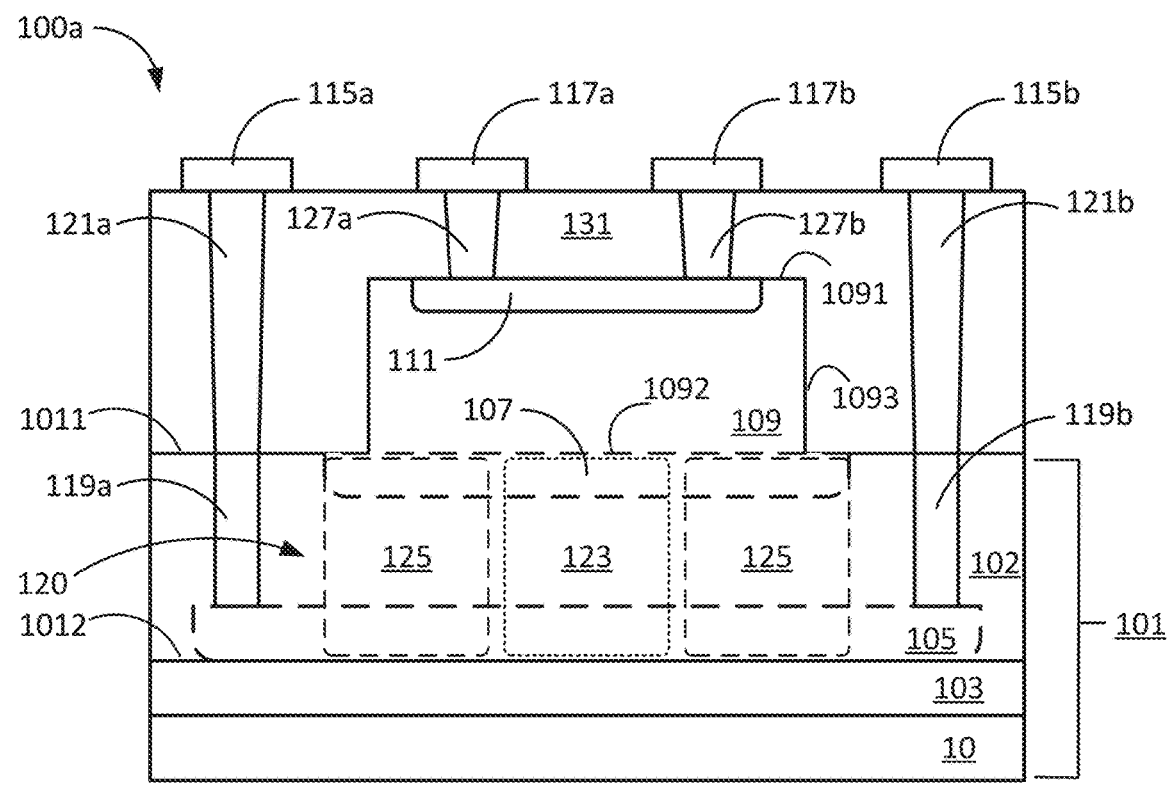
FIG. 1A illustrates a cross-sectional view of an optical sensing apparatus according to one or more embodiments of the present disclosure.
Figure 1B:
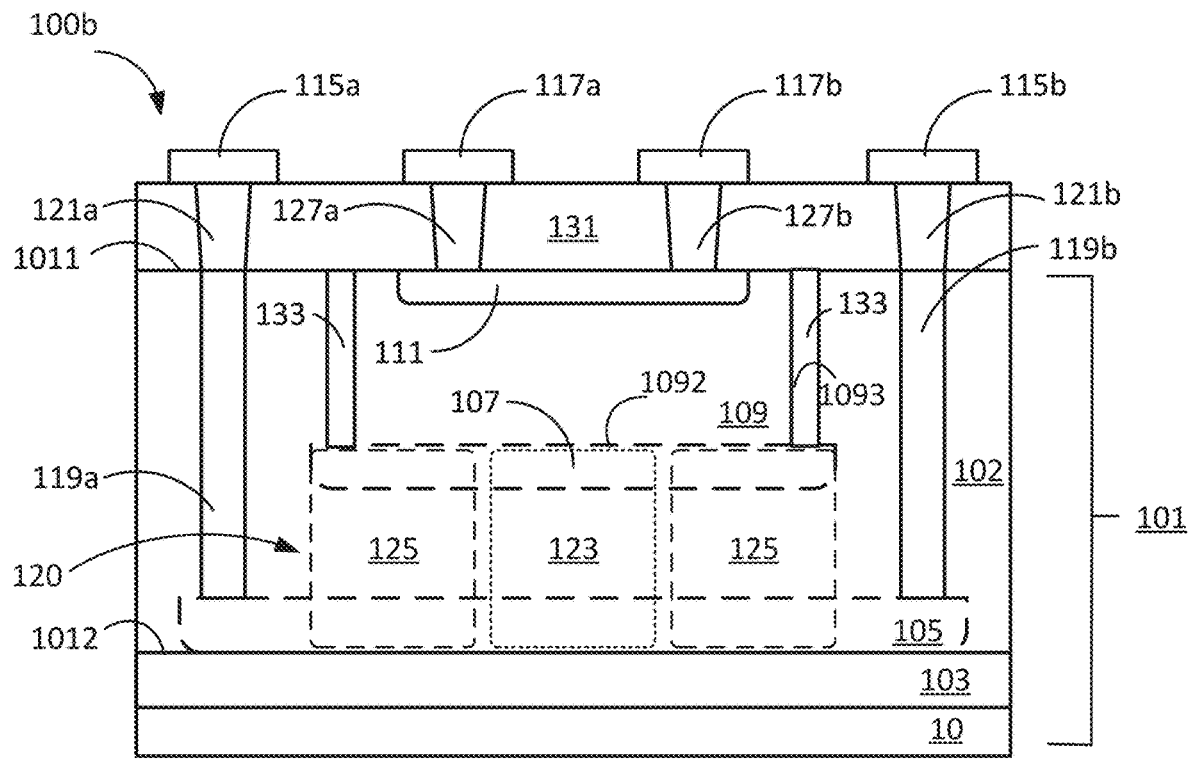
FIG. 1B illustrates a cross-sectional view of an optical sensing apparatus according to one or more embodiments of the present disclosure.

FIG. 1A illustrates a cross-sectional view of an optical sensing apparatus 100a according to one or more embodiments of the present disclosure. FIG. 1B illustrates a cross-sectional view of an optical sensing apparatus 100b according to one or more embodiments of the present disclosure. The optical sensing apparatus 100a/100b can be operated as an avalanche photodiode (APD) or a single-photon avalanche diode (SPAD).

Referring to FIG. 1A to FIG. 1B, the optical sensing apparatus 100a includes a substrate 101 including a first material (e.g., Si), an absorption region 109 including a second material (e.g., Ge), where the absorption region 109 is configured to receive an optical signal and generate photo-carriers in response to receiving the optical signal. The absorption region 109 is supported by the substrate 101 and includes a first interface 1091 and a second interface 1092 opposite to the first interface 1091. Referring to FIG. 1A, in some embodiments, the absorption region 109 is formed over the first interface 1011 of the substrate 101. Referring to FIG. 1B, in some embodiments, the absorption region 109 is embedded in the substrate 101.

In some embodiments, the substrate 101 includes a top layer 102 including a first interface 1011 and a second interface 1012 opposite to the first interface 1011 of the substrate 101. In some embodiments, the substrate 101 further includes an insulating layer 103 formed under the top layer 102. In some embodiments, the substrate 101 further includes a base layer 10 supported the insulating layer 103. In some embodiments, the base layer 10 includes the first material. In some embodiments, the substrate 101 may be a silicon on insulator (SOI) substrate. The second interface 1092 of the absorption region 109 is between the first interface 1091 and the second interface 1012 of the substrate 101. In some embodiments, the top layer 102 includes the first material.

In some embodiments, the optical sensing apparatus 100a further includes a buried-dopant region 105 formed in the substrate 101 (e.g., in the top layer 102 of the substrate and above the second interface 1012 of the substrate 101) and separated from the absorption region 109. The optical sensing apparatus 100a further includes an amplification region 120 formed in the substrate 101 and between the absorption region 109 and the buried-dopant region 105, where the amplification region 120 is configured to collect at least a portion of the photo-carriers from the absorption region 109 and to amplify the portion of the photo-carriers. The buried-dopant region 105 is of a first conductivity type (e.g., n-type) and is configured to collect at least a portion of the amplified photo-carriers from the amplification region 120. The amplification region 120 is formed using the first material (e.g., silicon). In some embodiments, the amplification region 120 may be doped with the dopants of the first conductivity type, where the doping of the amplification region 120 is lighter than the doping of the buried-dopant region 105.

In some embodiments, the optical sensing apparatus 100a further includes an interface-dopant region 107 formed in the substrate 101 (e.g., in the top layer 102 of the substrate) and between the absorption region 109 and the buried-dopant region 105. The interface-dopant region 107 is of a second conductivity type (e.g., p-type) different from the first conductivity type. In some embodiments, the amplification region 120 is between the interface-dopant region 107 and the buried-dopant region 105.

Figure 2A:
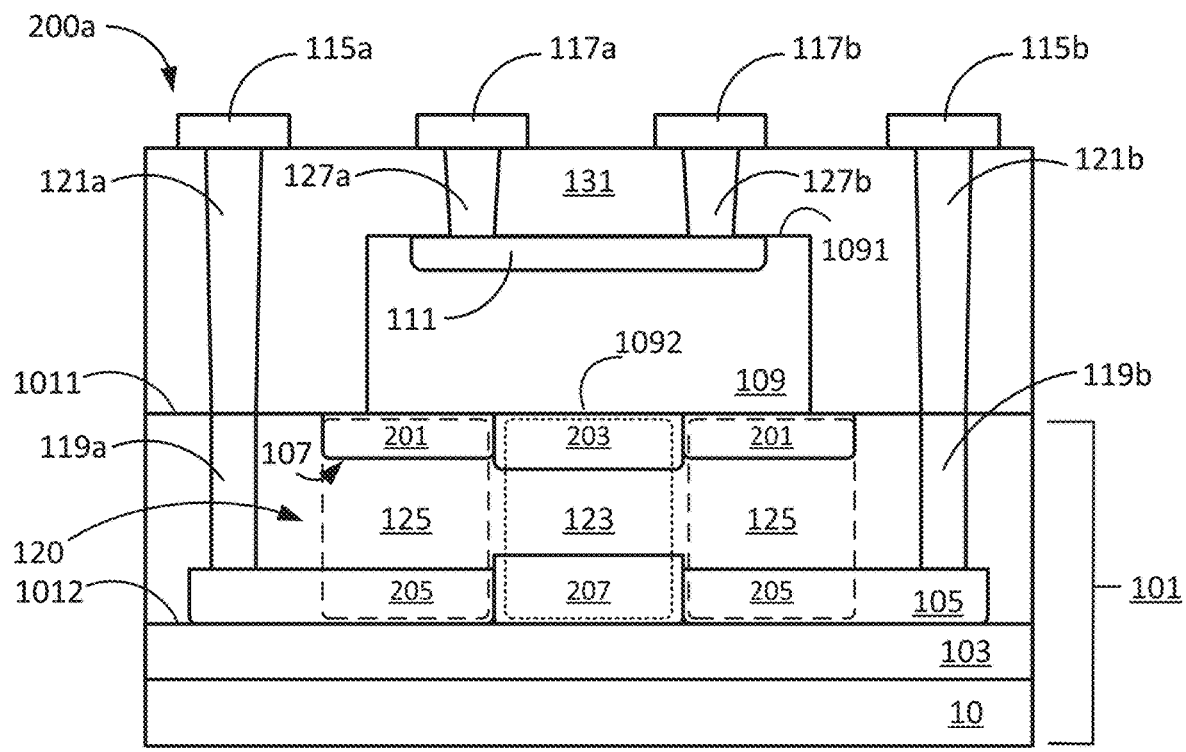
FIG. 2A illustrates a cross-sectional view of an optical sensing apparatus according to one or more embodiments of the present disclosure.
Figure 2B:
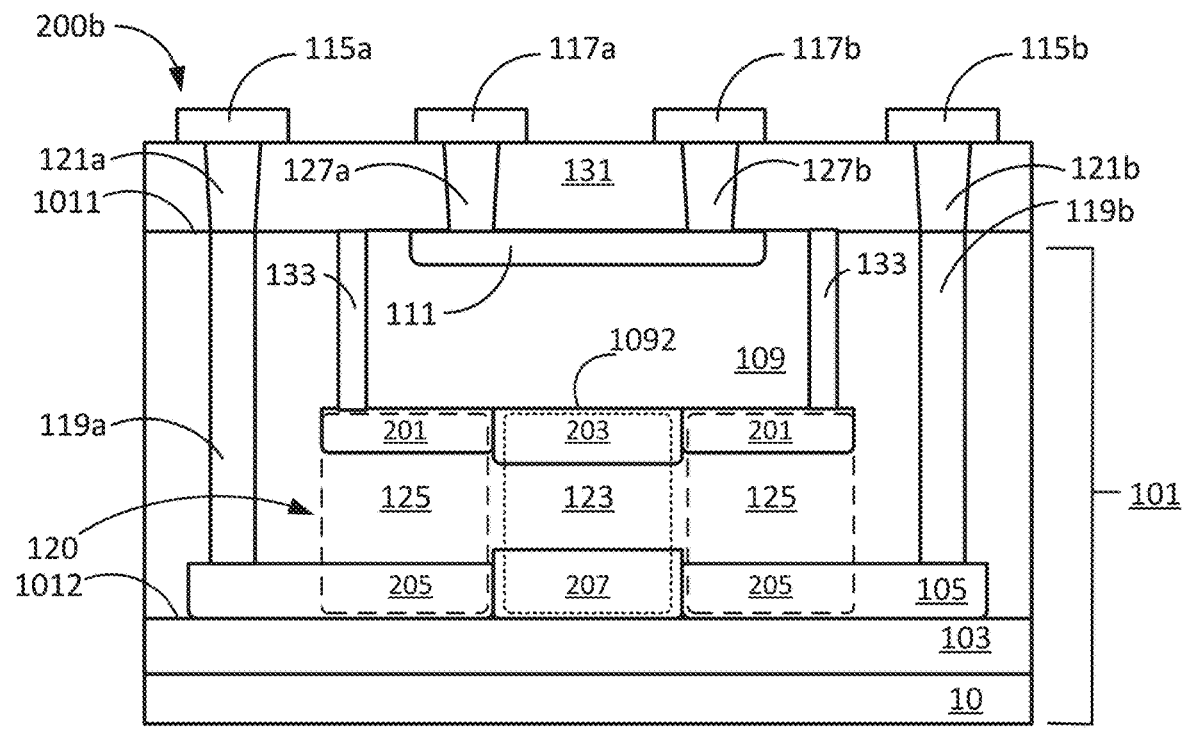
FIG. 2B illustrates a cross-sectional view of an optical sensing apparatus according to one or more embodiments of the present disclosure.

In some embodiments, at least one of the interface-dopant region 107 and the buried-dopant region 105 includes one or more first regions (e.g., first buried-dopant regions 207 and first interface-dopant regions 203 as described in FIGS. 2A and 2B) and one or more second regions (e.g., second buried-dopant regions 205 and second interface-dopant regions 201 as described in FIGS. 2A and 2B) surrounding the one or more first regions, where a property of the one or more first regions is different from a property of the second regions so as to form, under a reverse bias breakdown voltage (e.g., a first break-down voltage as described hereinafter), one or more punch-through regions 123 and one or more blocking regions 125 in the amplification region 120, since the electric field associated with the one or more punch-through region 123 is stronger than the electric field associated with the one or more blocking regions 125 at a reverse bias. In some embodiments, the one or more punch-through regions 123 are adjacent to the one or more first regions and the one or more blocking regions 125 are adjacent to the one or more second regions.

In some embodiments, the property includes peak doping concentration or depth. For example, a peak doping concentration of the one or more first regions (e.g., first buried-dopant regions 207 as described in FIGS. 2A and 2B) of the buried-dopant region 105 is greater than the than a peak doping concentration of the one or more second regions (e.g., second buried-dopant regions 205 as described in FIGS. 2A and 2B) of the buried-dopant region 105. For another example, a depth of the one or more first regions (e.g., first buried-dopant regions 207 as described in FIGS. 2A and 2B) is deeper than a depth of the one or more second regions (e.g., second buried-dopant regions 205 as described in FIGS. 2A and 2B). In some embodiments, the depth of the first regions and the second regions of the buried-dopant region 105 is measured by a distance from the second interface 1012 of the substrate 101 to the peak doping concentration.

For another example, a peak doping concentration of the one or more first regions (e.g., first interface-dopant regions 203 as described in FIGS. 2A and 2B) of the interface-dopant region 107 is lower than the than a peak doping concentration of the one or more second regions (e.g., second interface-dopant regions 201 as described in FIGS. 2A and 2B) of the interface-dopant region 107. For another example, a depth of the one or more first regions (e.g., first interface-dopant regions 203 as described in FIGS. 2A and 2B) of the interface-dopant region 107 is deeper than a depth of the one or more second regions (e.g., second interface-dopant regions 201 as described in FIGS. 2A and 2B) of the interface-dopant region 107. In some embodiments, the depth of the first regions and the second regions of the interface-dopant region 107 is measured by a distance from the second interface 1092 of the absorption region 109 to the peak doping concentration.

As disclosed in example embodiments in reference to FIGS. 2A-8B, by controlling one or more properties (e.g., dopant level, dopant depth, etc.) of the interface-dopant region 107 and the buried-dopant region 105, one or more blocking regions 125 can be formed around one or more punch-through regions 123. In general, the punch-through region(s) 123 has a first break-down voltage lower than a second break-down voltage associated with the one or more blocking regions 125, such that avalanche breakdown begins to occur in the punch-through region(s) 123 before the one or more blocking regions 125. Accordingly, the one or more punch-through regions 123 collect at least a portion of the photo-carriers from the absorption region 109 and amplify the collected photo-carriers under the first break-down voltage. Besides, the one or more blocking regions 125 may block at least a portion of the photo-carriers so as to guide the portion of the photo-carriers to enter the punch-through region(s) 123 under the first break-down voltage.

In other words, when the optical sensing apparatus 100a/100b is in operation at a reverse bias, the electric field associated with the one or more punch-through regions 123 is stronger than the electric field associated with the one or more blocking regions 125. As a result, the breakdown region can be confined in the punch-through regions 123 instead of the whole amplification region 120. These punch-through regions 123 and the blocking regions 125 as field-controlled regions with different punch-through/breakdown voltages help to avoid premature breakdown in avalanche photodiode (APD)/single-photon avalanche diode (SPAD), which improves sensitivity and/or reduces amplification of dark current. Accordingly, the optical sensing apparatus 100a, 100b has better performance such as higher sensitivity and longer detection distance.

In some embodiments, the optical sensing apparatus 100a, 100b further includes a cladding layer 131 formed surrounding or over the absorption region 109, depending on the arrangement of the absorption region 109 and the substrate 101. In some embodiments, the cladding layer 131 includes insulating material (e.g., oxide) for electrical isolation between two conductive regions (e.g., the second conductive regions 121a/121b and the third conductive regions 127a/127b as described herein after)

In some embodiments, the optical sensing apparatus 100a, 100b further includes one or more first contacts 115a/115b formed on the cladding layer 131 and electrically coupled to the buried-dopant region 105, where the one or more first contacts 115a/115b are configured to provide at least a portion of the photo-carriers from the buried-dopant region 105 as a readout signal. For example, a readout circuitry (not shown) may be coupled to the one or more first contacts 115a/115b.

In some embodiments, the optical sensing apparatus 100a, 100b further includes one or more first conductive regions 119a/119b formed in the substrate 101 (e.g., in the top layer 102 of the substrate 101) and electrically coupled to the buried-dopant region 105. In some embodiments, the one or more first conductive regions 119a/119b can be of the first conductivity type and doped with a dopant having a peak doping concentration not less than about $5 \times 10^{18}$ cm$^{-3}$ (e.g., about $1 \times 10^{19}$ cm$^{-3}$). In some embodiments, the substrate 101 is substantially devoid of metal material between the first interface 1011 and the second interface 1012 so as to maintain the material integrity of the top layer 102 of the substrate 101, which improves the performance of the optical sensing apparatus 100a, 100b.

The optical sensing apparatus 100a, 100b further includes one or more second conductive regions 121a/121b formed in the cladding layer 131, where each one of the one or more second conductive regions 121a/121b is electrically coupled to (i) a respective one of the one or more first contacts 115a/115b, and (ii) a respective one of the one or more first conductive regions 119a/119b.

In some embodiments, the optical sensing apparatus 100a, 100b includes a doped contact region 111 of the second conductivity type formed between the absorption region 109 and the cladding layer 131 or formed in the absorption region 109. In some embodiments, the doping concentration of the doped contact region 111 can be between about $1 \times 10^{18}$ cm$^{-3}$ and $5 \times 10^{20}$ cm$^{-3}$. The doped contact region 111 is configured to collect photo-carriers of a first type, and where the buried-dopant region 105 is configured to collect photo-carriers of a second type. For example, when the doped contact region 111 is of p-type and the buried-dopant region 105 is of n-type, the doped contact region 111 is configured to collect holes and the buried-dopant region 105 is configured to collect electrons. In some embodiments, the doped contact region 111 includes the first material or the second material.

In some embodiments, the optical sensing apparatus 100a, 100b includes one or more second contacts 117a/117b over the cladding layer 131. In some embodiments, the optical sensing apparatus 100a, 100b includes one or more third conductive regions 127a/127b formed in the cladding layer 131 for electrical connection between the doped contact region 111 and the respective one or more second contacts 117a/117b.

In some embodiments, the second conductive regions 121a/121b and the third conductive regions 127a/127b may be vias filled with metal.

In some embodiments, the absorption region 109 is p-doped, and the buried-dopant region 105 is n-doped. For example, the absorption region 109 is doped with a peak doping concentration between about $1 \times 10^{17}$ cm$^{-3}$ and $1 \times 10^{19}$ cm$^{-3}$. The buried-dopant region 105 is not less than about $5 \times 10^{18}$ cm$^{-3}$ (e.g., about $1 \times 10^{19}$ cm$^{-3}$).

In some embodiments, the absorption region 109 is of the second conductivity type and has a gradient doping profile. For example, the gradient doping profile can be graded from a first interface 1091 of the absorption region 109 or from a doped contact region 111 to a second interface 1092 of the absorption region 109. In some embodiments, the gradient doping profile can be a gradual decrease/increase or a step-like decrease/increase depending on the moving direction of the carriers (e.g., electrons, when the buried-dopant region 105 is n-type). In some embodiments, the concentration of the gradient doping profile is gradually deceased/increased from the first interface 1091 or the doped contact region 111 of the absorption region 109 to the second interface 1092 of the absorption region 109 depending on the moving direction of the carriers.

In some embodiments, the concentration of the gradient doping profile is gradually such as radially deceased/increased from a center of the first interface 1091 or the doped contact region 111 of the absorption region 109 to the second interface 1092 and to the side interfaces 1093 of the absorption region 109 depending on the moving direction of the carriers (e.g., electrons, when the buried-dopant region 105 is n-type). For example, when the doped contact region 111 is of p-type, electrons move in the absorption region 109 substantially along a direction from the first interface 1091 to the second interface 1092, the concentration of the gradient doping profile of the dopant in the absorption region 109, for example, boron, is gradually deceased from the first interface 1091 or from the doped contact region 111 to the second interface 1092 of the absorption region 109. In some embodiments, the concentration of the gradient doping profile is gradually and laterally decreased/increased from an edge of the first interface 1091 or the doped contact region 111 of the absorption region 109 to the side interfaces 1093 of the absorption region 109 depending on the moving direction of the carriers (e.g., electrons, when the buried-dopant region 105 is n-type).

Referring to FIG. 1A, in some embodiments, the absorption region 109 is over the first interface 1011 of the substrate 101. In some embodiments, the optical sensing apparatus 100a may further include a passivation layer (not shown) covering the interface (e.g., first interface 1091 and side interface 1093) of the absorption region 109 for protecting the absorption region 109. Referring to FIG. 1B, in some embodiments, the absorption region 109 is embedded in the substrate 101, for example, embedded in the top layer 102 of the substrate 101. In some embodiments, the optical sensing apparatus 100b further includes one or more sidewall-dopant regions 133 surrounding the absorption region 109 for blocking the carriers (e.g., electrons when the buried-dopant region 105 is of n-type) from entering the top layer 102 through the side interface 1093 of the absorption region 109, and thus the one or more sidewall-dopant regions 133 further facilities the carriers entering the amplification region 120 between the absorption region 109 and the buried-dopant region 105. In some embodiments, the sidewall-dopant regions 133 is of the second conductivity type (e.g., p-type). In some embodiments, the peak doping concentration of the sidewall-dopant regions 133 is not less than $1 \times 10^{17}$ cm$^{-3}$. In some embodiments, the passivation layer includes a material different from the second material.

For example, the passivation layer may include amorphous silicon, poly silicon, epitaxial silicon, aluminum oxide (e.g., AlxOy), silicon oxide (e.g., SixOy), Ge oxide (e.g., GexOy), germanium-silicon (e.g., GeSi), silicon nitride family (e.g., SixNy), high-k materials (e.g., HfOx, ZnOx, LaOx, LaSiOx), and any combination thereof. In some embodiments, the sidewall-dopant regions 133 may include first material (e.g., single crystal silicon).

In some embodiments, the absorption region 109 of the optical sensing apparatus has a width greater than 10 μm. For example, the width of the absorption region 109 can be 250 μm, or 700 μm. By having the absorption region 109 in a large dimension, a lens over the absorption region 109 may not be necessary, which may reduce the cost of the optical sensing apparatus 100a, 100b and also alleviate a problem of shielding optical signal by the lens.

In some embodiments, the absorption region 109 is p-doped, and where the buried-dopant region 105 is n-doped. For example, the absorption region 109 is doped with a peak doping concentration between about between $1 \times 10^{17}$ cm$^{-3}$ and $1 \times 10^{19}$ cm$^{-3}$. The buried-dopant region 105 is not less than about $5 \times 10^{18}$ cm$^{-3}$ (e.g., about $1 \times 10^{19}$ cm$^{-3}$).

FIG. 2A illustrates a cross-sectional view of an optical sensing apparatus 200a according to one or more embodiments of the present disclosure. FIG. 2B illustrates a cross-sectional view of an optical sensing apparatus 200b according to one or more embodiments of the present disclosure.

Referring to FIG. 2A to FIG. 2B, in some embodiments, the buried-dopant region 105 includes one or more first buried-dopant regions 207 having a first peak doping concentration (e.g., not less than about $5 \times 10^{18}$ cm$^{-3}$, such as about $1 \times 10^{19}$ cm$^{-3}$) and a first depth. In some embodiments, the buried-dopant region 105 further includes one or more second buried-dopant regions 205 surrounding the one or more first buried-dopant regions 207 and having a second peak doping concentration and a second depth, where at least one or more of (i) the second peak doping concentration (e.g., not less than $5 \times 10^{17}$ cm$^{-3}$, such as about $1 \times 10^{18}$ cm$^{-3}$) is lower than the first peak doping concentration, or (ii) the second depth is shallower than the first depth. In some embodiments, the first depth of the first buried-dopant regions 207 is measured by a distance from the second interface 1012 of the substrate 101 to the first peak doping concentration, and the second depth of the second buried-dopant regions 205 is measured by a distance from the second interface 1012 of the substrate 101 to the second peak doping concentration.

Under a reverse bias breakdown voltage (e.g., the first break-down voltage as described above), one or more punch-through regions 123 and one or more blocking regions 125 in the amplification region 120 can be formed, where the one or more punch-through regions 123 are adjacent to the one or more first buried-dopant regions 207 and the one or more blocking regions 125 are adjacent to the one or more second buried-dopant regions 205.

In some embodiments, the interface-dopant region 107 further includes one or more first interface-dopant regions 203 having a third peak doping concentration and a third depth. The interface-dopant region 107 further includes one or more second interface-dopant regions 201 having a fourth peak doping concentration and a fourth depth, where at least one or more of (i) the fourth peak doping concentration (e.g., not less than about $1 \times 10^{17}$ cm$^{-3}$ or $2 \times 10^{17}$ cm$^{-3}$) is higher than the third peak doping concentration (e.g., not less than about $1 \times 10^{17}$ cm$^{-3}$), or (ii) the fourth depth is shallower than the third depth. In some embodiments, the third depth of the first interface-dopant regions 203 is measured by a distance from the second interface 1092 of the absorption region 109 to the third peak doping concentration, and the fourth depth of the second interface-dopant regions 201 is measured by a distance from the second interface 1092 of the absorption region 109 to the fourth peak doping concentration. In some embodiments, a ratio of the fourth peak doping concentration to the third peak doping concentration is not more than 10.

Under a reverse bias breakdown voltage (e.g., the first break-down voltage as described above), one or more punch-through regions 123 and one or more blocking regions 125 in the amplification region 120 can be formed, where the one or more punch-through regions 123 are adjacent to the one or more first interface-dopant regions 203 and the one or more blocking regions 125 are adjacent to the one or more second interface-dopant regions 201. In some embodiments, under a reverse bias breakdown voltage (e.g., the first break-down voltage as described above), one or more punch-through regions in the amplification region 120 can be formed between the first interface-dopant regions 203 and the first buried-dopant regions 207, and one or more blocking regions 125 in the amplification region 120 can be formed between the second interface-dopant regions 201 and the second buried-dopant regions 205.

In some embodiments, a difference between the first peak doping concentration of the one or more first buried-dopant regions 207 and the third peak doping concentration of the one or more first interface-dopant regions 203 is greater than a difference between the second peak doping concentration of the one or more second buried-dopant regions 205 and the fourth peak doping concentration of the one or more second interface-dopant regions 201.

Referring to FIG. 2A, in some embodiments, a first distance between the first buried-dopant regions 207 and the first interface-dopant regions 203 is less than a second distance between second buried-dopant regions 205 and the second interface-dopant regions 201. At a reverse bias, the electric field associated with the punch-through region 123 is stronger than the electric field associated with the blocking regions 125. As a result, a first break-down voltage associated with the one or more punch-through regions 123 is lower than a second break-down voltage associated with the one or more blocking regions 125. In some embodiments, the first distance is measured from the distance between the first peak doping concentration and the third peak doping concentration. The second distance is measured from the distance between the second peak doping concentration and the fourth peak doping concentration.

By having the fourth peak doping concentration of the one or more second interface-dopant regions 201 higher than the third peak doping concentration of the one or more first interface-dopant regions 203, the carriers (e.g., electrons when the buried-dopant region 105 is of n-type) can be guided into the punch-through regions 123 through the first interface-dopant regions 203. As a result, an interface area where carriers passing through is confined, which reduces the dark current of the optical sensing apparatus 200a, 200b.

Referring to FIG. 2A, in some embodiments, the absorption region 109 is over the first interface 1011 of the substrate 101. In some embodiments, the optical sensing apparatus 200a may further include a passivation layer (not shown) covering the interface (e.g., first interface 1091 and side interface) of the absorption region 109 for protecting the absorption region 109. Referring to FIG. 2B, in some embodiments, the absorption region 109 is embedded in the substrate 101, for example, embedded in the top layer 102 of the substrate 101. In some embodiments, the sidewall-dopant regions 133 has a peak doping concentration higher than the third peak doping concentration of the one or more first interface-dopant regions 203 for further facilitating the carriers entering the amplification region 120 through the one or more first interface-dopant regions 203, which further confines the punch-through regions 123 where breakdown occurs at the first break-down voltage. In some embodiments, the peak doping concentration of the sidewall-dopant regions 133 is not less than $1 \times 10^{17}$ cm$^{-3}$.

Figure 3A:
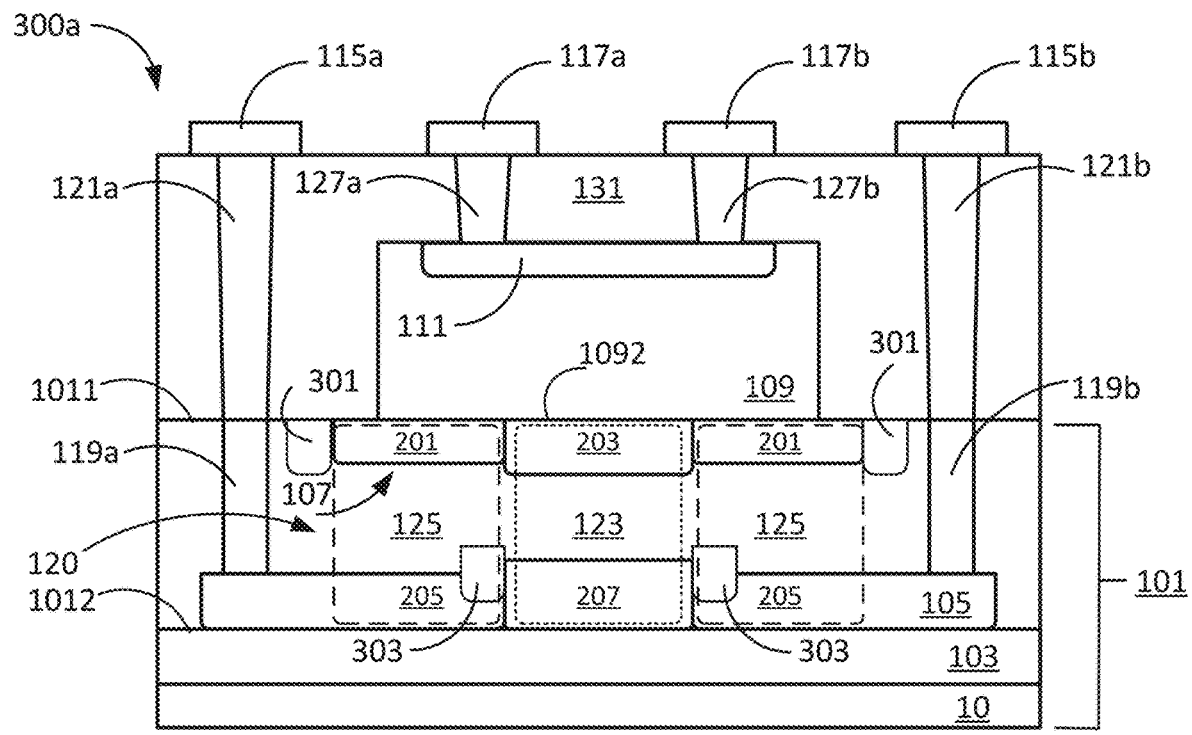
FIG. 3A illustrates a cross-sectional view of an optical sensing apparatus according to one or more embodiments of the present disclosure.
Figure 3B:
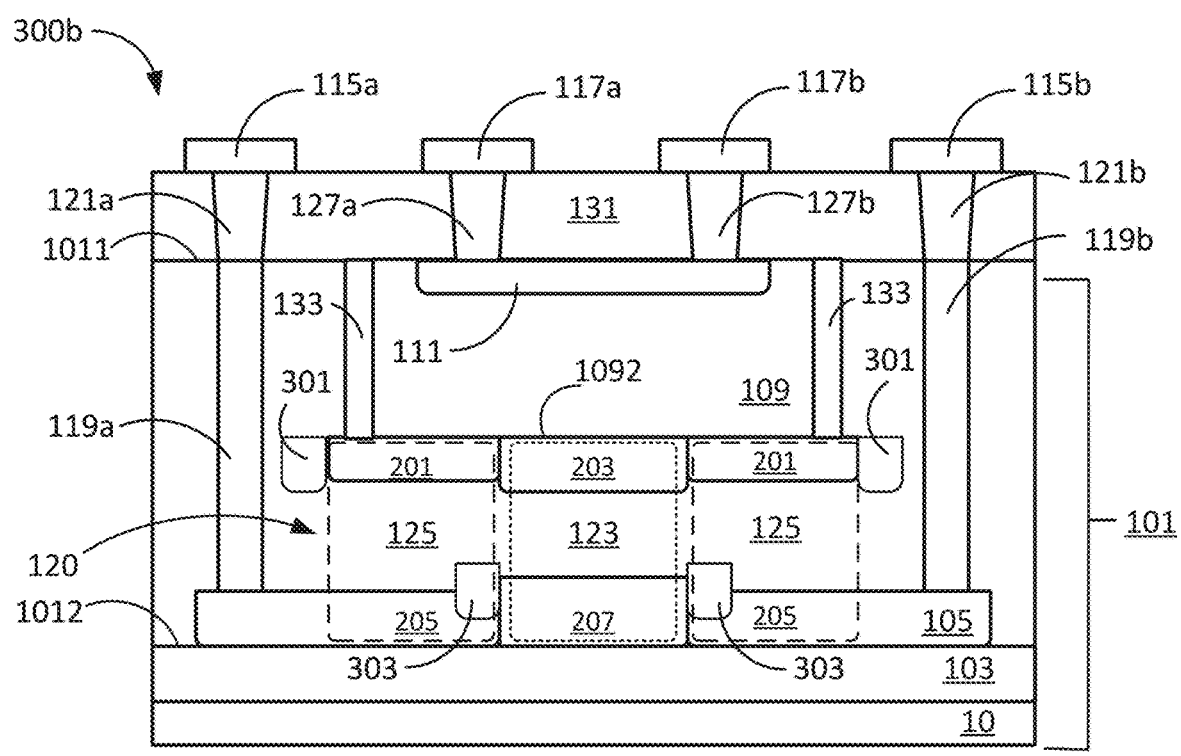
FIG. 3B illustrates a cross-sectional view of an optical sensing apparatus according to one or more embodiments of the present disclosure.

FIG. 3A illustrates a cross-sectional view of an optical sensing apparatus 300a according to one or more embodiments of the present disclosure. FIG. 3B illustrates a cross-sectional view of an optical sensing apparatus 300b according to one or more embodiments of the present disclosure.

Referring to FIG. 3A to FIG. 3B, in some embodiments, the buried-dopant region 105 includes one or more first doped guard-rings 303 having a fifth peak doping concentration (e.g., not more than about $5 \times 10^{18}$ cm$^{-3}$), the one or more first doped guard-rings 303 surrounding the one or more first buried-dopant regions 207, where the fifth peak doping concentration of the one or more first doped guard-rings 303 is lower than the first peak doping concentration of the one or more first buried-dopant regions 207. For example, a ratio of the first peak doping concentration to the fifth peak doping concentration is not less than 5 (e.g., about 10). The one or more first doped guard-rings 303 are configured to adjust an electric field associated with edges or corners of the one or more first buried-dopant regions 207. For example, by having the first doped guard-rings 303 surrounding the one or more first buried-dopant regions 207, the electric field associated with edges or corners of the one or more first buried-dopant regions 207 may be reduced, which further confines the punch-through regions 123 where breakdown occurs at the first break-down voltage.

Referring to FIG. 3A and to FIG. 3B, in some embodiments, where the interface-dopant region 107 further includes one or more second doped guard-rings 301 having a sixth peak doping concentration (e.g., not more than about $1 \times 10^{17}$ cm$^{-3}$), where the one or more second doped guard-rings 301 surround the one or more second interface-dopant regions 201. In some embodiments, the sixth peak doping concentration is lower than the fourth peak doping concentration of one or more second interface-dopant regions 201. For example, a ratio of the fourth peak doping concentration of the one or more second interface-dopant regions 201 to the sixth peak doping concentration of the one or more second doped guard-rings 301 is not less than 5 (e.g., about 10). The one or more second doped guard-rings 301 are configured to adjust an electric field associated with edges or corners of the one or more second interface-dopant regions 201. For example, by having the second doped guard-rings 301 surrounding the one or more second interface-dopant regions 201, the electric field associated with edges or corners of the one or more second interface-dopant regions 201 may be reduced, which alleviates the problem of break down occurring between the interface-dopant region 107 and the one or more first conductive regions 119a/119b.

Figure 4A:
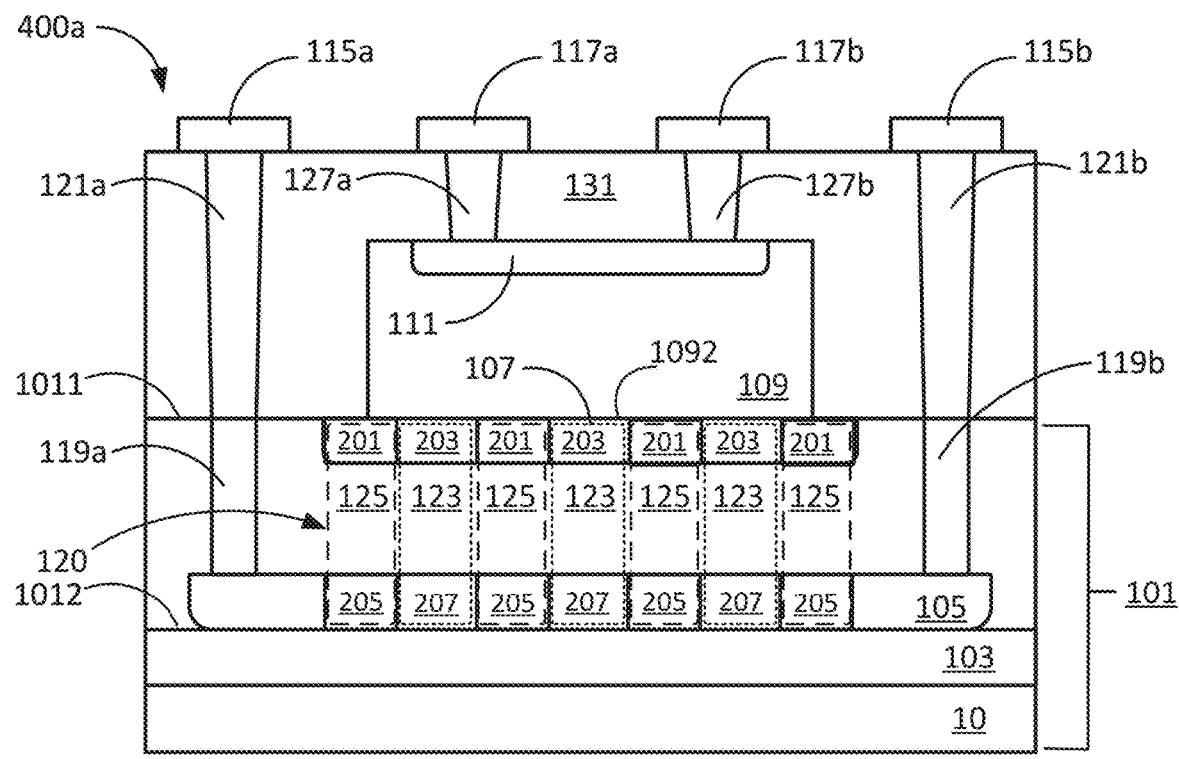
FIGS. 4A-4D illustrate cross-sectional views of an optical sensing apparatus according to one or more embodiments of the present disclosure.
Figure 4B:
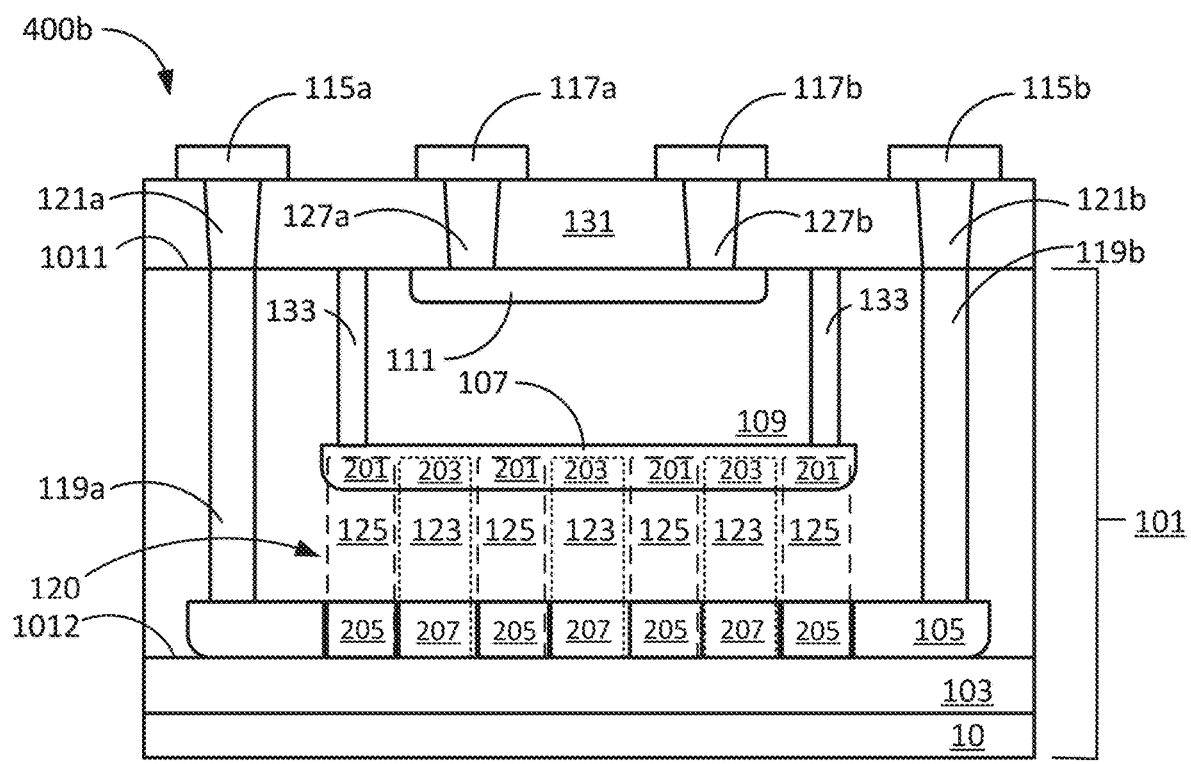

FIG. 4A illustrates a cross-sectional view of an optical sensing apparatus 400a according to one or more embodiments of the present disclosure. FIG. 4B illustrates a cross-sectional view of an optical sensing apparatus 400b according to one or more embodiments of the present disclosure.

Referring to FIG. 4A, FIG. 4B, in some embodiments, the interface-dopant region 107 includes multiple first interface-dopant regions 203 and multiple second interface-dopant regions 201 so as to form multiple punch-through regions 123 and multiple blocking regions 125 under the first break-down voltage. In some embodiments, the multiple first interface-dopant regions 203 are separated by the multiple second interface-dopant regions 201, and thus the multiple punch-through regions 123 and multiple blocking regions 125 are alternate formed under the first break-down voltage.

By forming the multiple first interface-dopant regions separated by the multiple second interface-dopant regions, multiple breakdown routes (e.g., multiple punch-through regions 123) are formed for the carriers (e.g., electrons when the buried-dopant region 105 is of n-type) flowing from the absorption region 109 to the buried-dopant region 105 under the first break-down voltage. As a result, the carriers can be guided into the amplification region 120 uniformly under reverse bias, which increases the speed and the quantum efficiency of the optical sensing apparatus 400a, 400b.

In some embodiments, the buried-dopant region 105 includes multiple first buried-dopant regions 207 and the buried-dopant region 105 includes multiple second buried-dopant regions 205 so as to form multiple punch-through regions 123 and multiple blocking regions 125 under the first break-down voltage. In some embodiments, the multiple first buried-dopant regions 207 are separated by the multiple second buried-dopant regions 205, and thus the multiple punch-through regions 123 and multiple blocking regions 125 are alternate formed under the first break-down voltage.

Figure 4C:
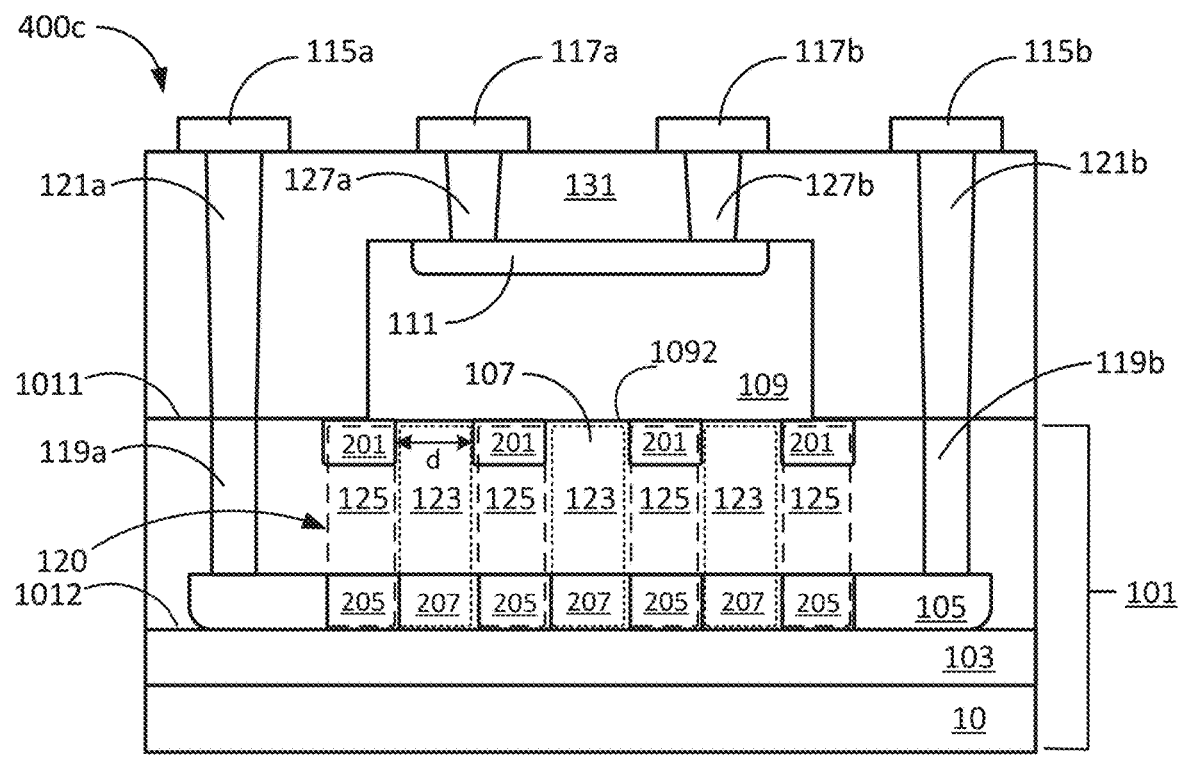
Figure 4D:
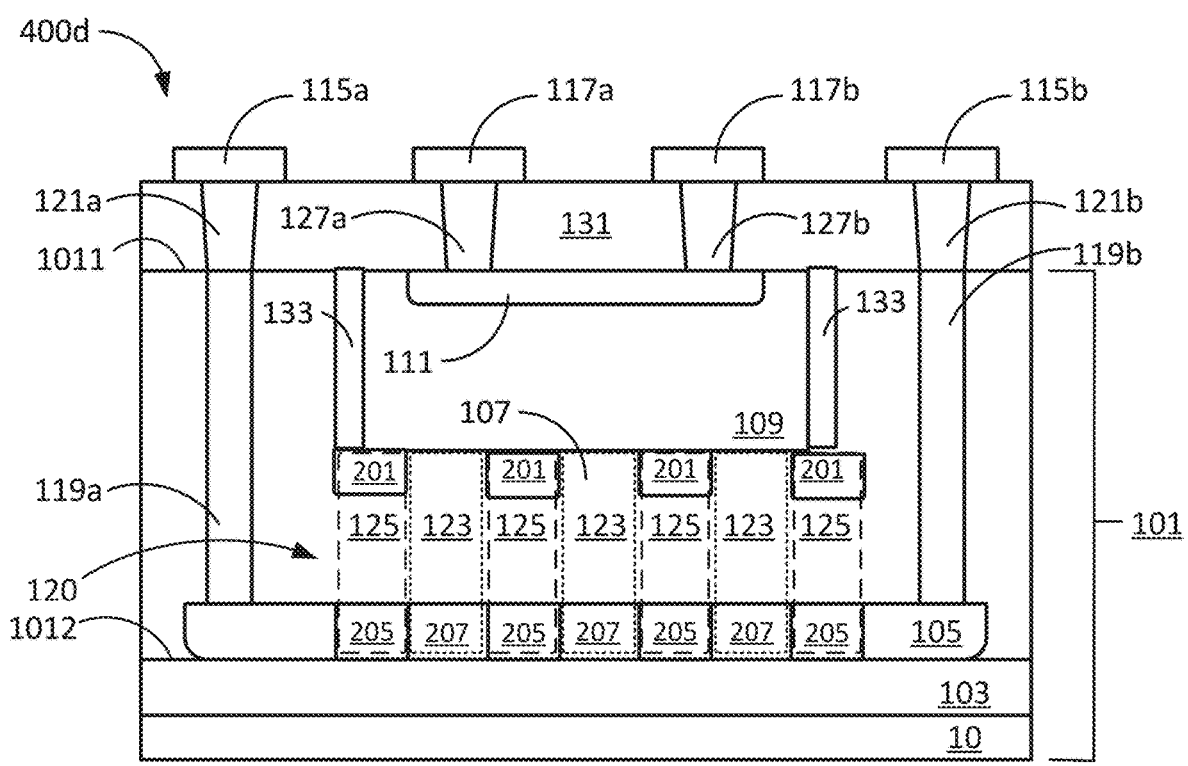

Referring to FIGS. 4C and 4D as examples, in some embodiments, the multiple punch-through regions 123 may be formed without the first interface-dopant regions 203. Specifically, when a distance between two second interface-dopant regions 201 is under a threshold distance d (as illustrated in FIG. 4C), the corner fields formed between the second interface-dopant regions 201 form a punch-through region 123 under the first break-down voltage. As an example, the threshold distance d can be on the order of several-hundred nm (e.g., 200 nm, 300 nm, 500 nm, or a distance that provides sufficient corner fields to form the punch-through region.) or below 1 μm. Such embodiments are advantageous because removing the first interface-dopant regions 203 may simplify the fabrication process of the device.

By having the multiple first buried-dopant regions separated by the multiple second buried-dopant regions, multiple breakdown routes (e.g., multiple punch-through regions 123s) are formed for the carriers (e.g., electrons when the buried-dopant region 105 is of n-type) flowing from the absorption region 109 to the buried-dopant region 105 under the first break-down voltage. As a result, the carriers can be guided into the amplification region 120 uniformly under reverse bias, which increases the speed and the quantum efficiency of the optical sensing apparatus.

Figure 5A:
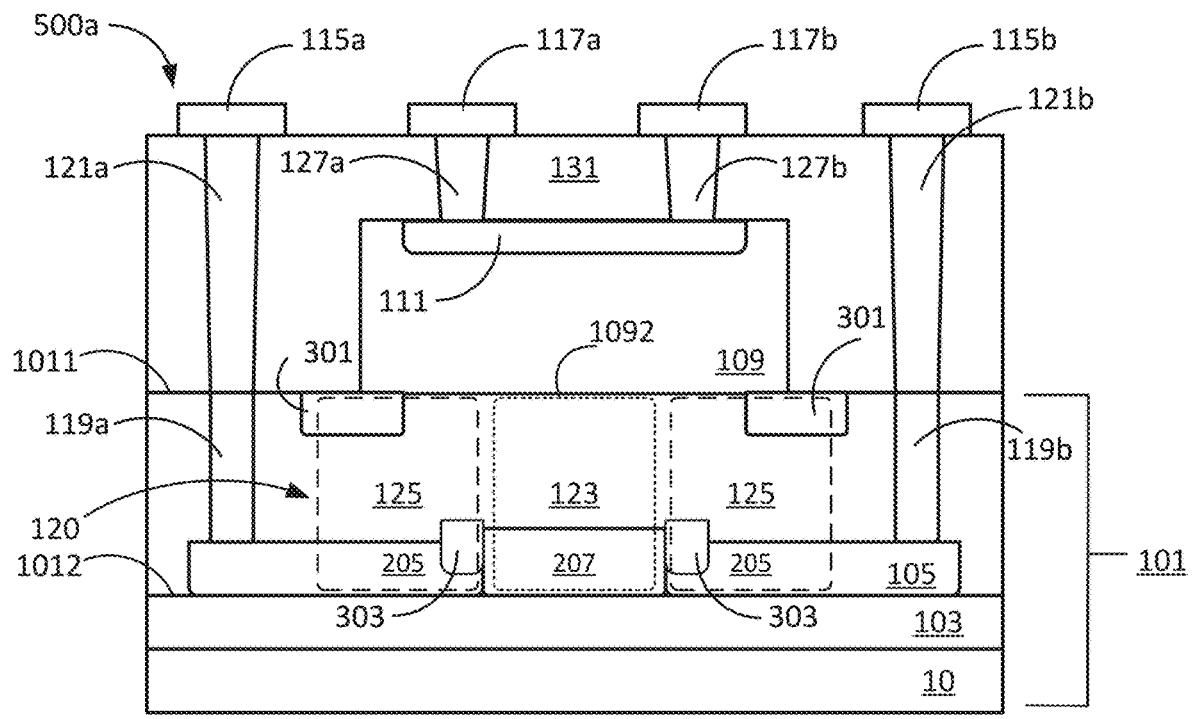
FIG. 5A illustrates a cross-sectional view of an optical sensing apparatus according to one or more embodiments of the present disclosure.
Figure 5B:
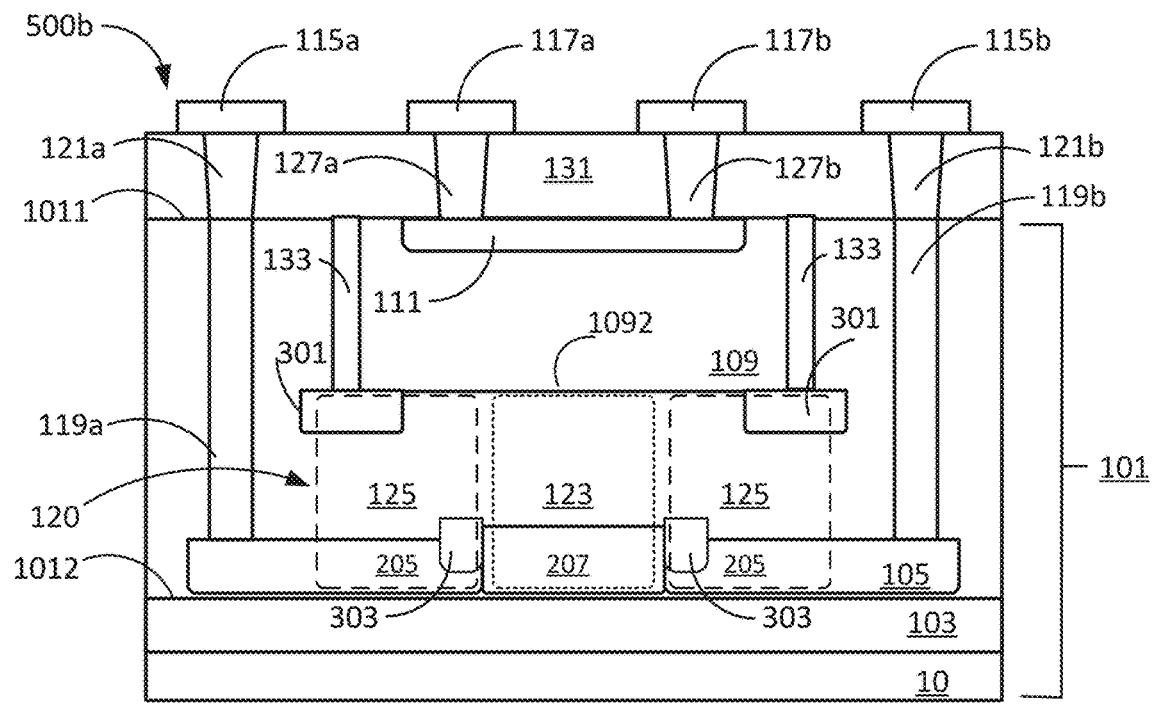
FIG. 5B illustrates a cross-sectional view of an optical sensing apparatus according to one or more embodiments of the present disclosure.

FIG. 5A illustrates a cross-sectional view of an optical sensing apparatus 500a according to one or more embodiments of the present disclosure. FIG. 5B illustrates a cross-sectional view of an optical sensing apparatus 500b according to one or more embodiments of the present disclosure. In some embodiments, a distance between the first buried-dopant regions 207 and the second interface 1092 of the absorption region 109 is less than a distance between second buried-dopant regions 205 and the second interface 1092 of the absorption region 109. As a result, the electric field associated with the first buried-dopant regions 207 is stronger than the electric field associated with the second buried-dopant regions 205.

Figure 6A:
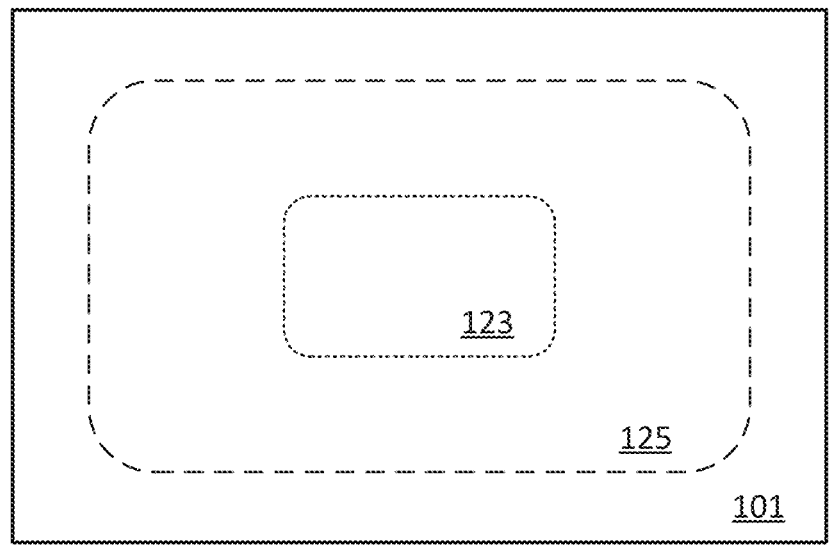
FIG. 6A illustrates a top view of an optical sensing apparatus according to one or more embodiments of the present disclosure.

FIG. 6A illustrates a top view of an optical sensing apparatus 600a according to one or more embodiments of the present disclosure. The optical sensing apparatus 600a can be, for example, any of the optical sensing apparatus 100a, 100b, 200a, 200b, 300a, 300b, 500a, or 500b. In some embodiments, the first buried-dopant region 207 is surrounded by the second buried-dopant regions 205 such that the punch-through region 123 is surrounded by the blocking region 125 under the first break-down voltage. In some embodiments, the first interface-dopant region 203 is surrounded by the second interface-dopant regions 201 such that the punch-through region 123 is surrounded by the blocking region 125 under the first break-down voltage.

Figure 6B:
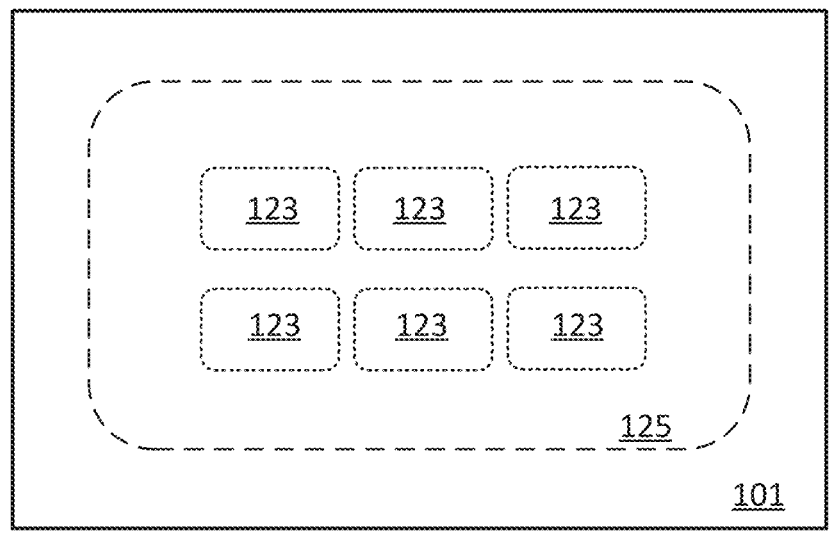
FIG. 6B illustrates a top view of an optical sensing apparatus according to one or more embodiments of the present disclosure.

FIG. 6B illustrates a top view of an optical sensing apparatus 600b according to one or more embodiments of the present disclosure. The optical sensing apparatus 600a can be, for example, any of the optical sensing apparatus 400a, or 400b. In some embodiments, the multiple first buried-dopant regions 207 are surrounded by the second buried-dopant regions 205 such that the multiple punch-through regions 123 are surrounded by the blocking region 125 under the first break-down voltage. In some embodiments, the multiple first interface-dopant regions 203 are surrounded by the second interface-dopant regions 201 such that the multiple punch-through region 123 is surrounded by the blocking region 125 under the first break-down voltage. FIG. 6A and FIG. 6B illustrates some example arrangement of the punch-through regions 123 and the blocking region 125 based on different arrangements of the first interface-dopant regions 203 and the second interface-dopant regions 201 and the different arrangements of the first buried-dopant regions 207 and the second buried-dopant regions 205. However, the present disclosure is not limited to the arrangement illustrate in FIG. 6A and FIG. 6B.

Figure 7A:
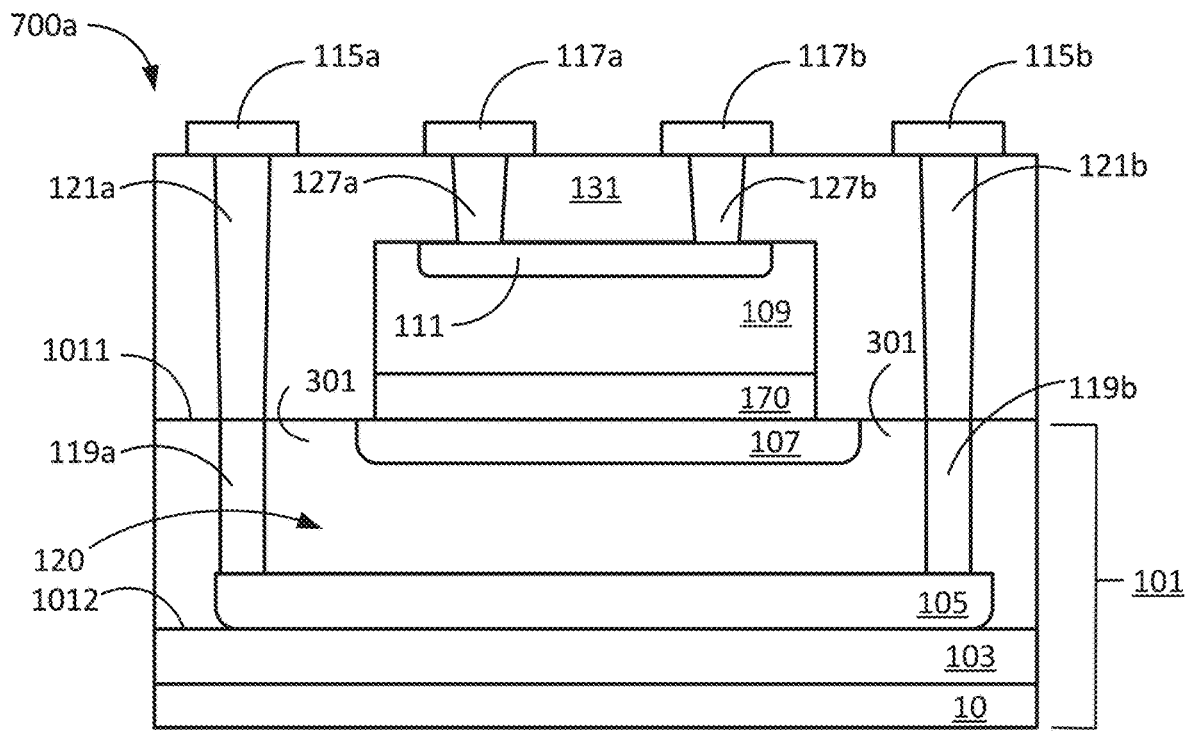
FIGS. 7A-7D illustrate cross-sectional views of an optical sensing apparatus according to one or more embodiments of the present disclosure.
Figure 7B:
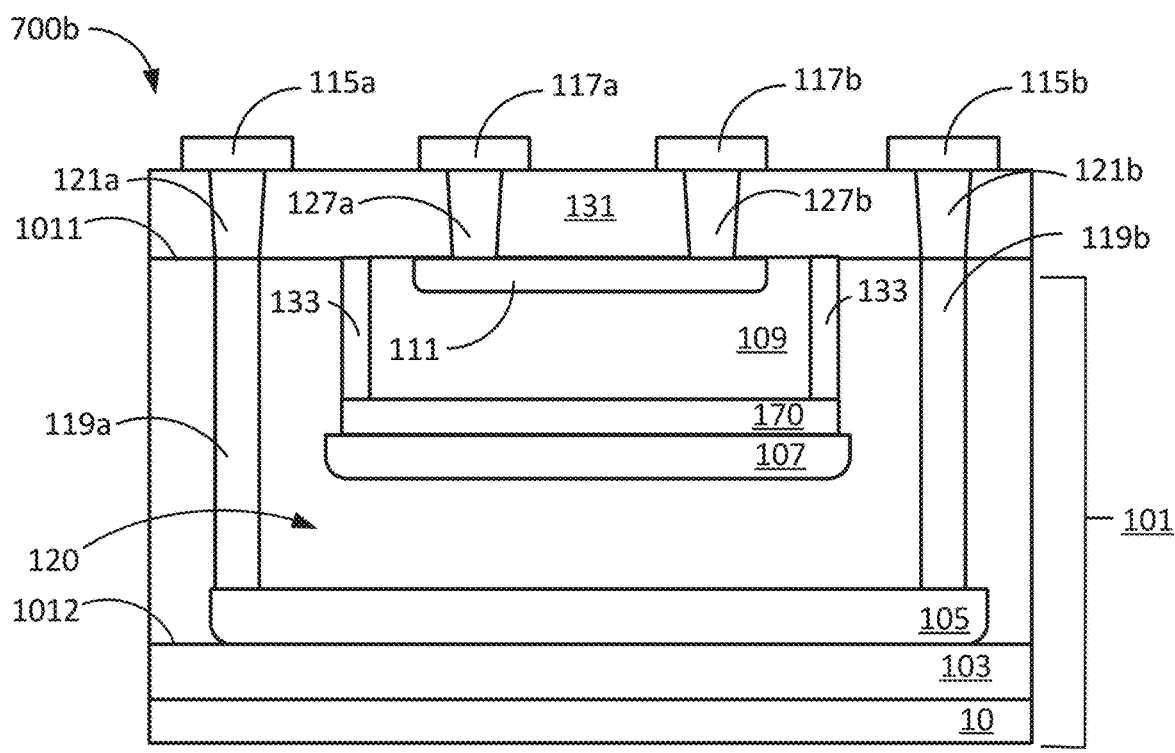

FIG. 7A illustrates a cross-sectional view of an optical sensing apparatus 700a according to one or more embodiments of the present disclosure. FIG. 7B illustrates a cross-sectional view of an optical sensing apparatus 700b according to one or more embodiments of the present disclosure. In some embodiments, the optical sensing apparatus 700a, 700b further includes a buffer layer 170 between the absorption region 109 and the buried-dopant region 105. In some embodiments, the buffer layer 170 is formed between the absorption region 109 and the interface-dopant region 107. In some embodiments, the buffer layer 170 is formed using the first material (e.g., single crystal silicon). In some embodiments, the buffer layer 170 may include a material the same as the material of the sidewall-dopant regions 133. In some embodiments, the buffer layer 170 has a thickness between 200 nm and 400 nm. In some other embodiments, the buffer layer 170 has a thickness between 100 nm and 300 nm. In some embodiments, the buffer layer 170 is intrinsic and has a thickness for distributing electric field along a direction substantially perpendicular to a first interface 1011 of the substrate 101. For example, the buffer layer 170 may have a thickness not less than 150 nm, which facilitates lowering the electric field in the absorption region 109, and thus the dark current of the optical sensing apparatus 700a, 700b is further reduced. As another example, the buffer layer 170 may have a thickness not less than 50 nm. Besides, compared to a comparative optical sensing apparatus without the buffer layer 170 or having a buffer layer 170 with a thickness of a few nms or a few tens of nms, the optical sensing apparatus 700a, 700b of the present disclosure has a lower electric filed in the buffer layer 170, which also alleviates the problem of breakdown phenomenon or carrier tunneling in the buffer layer 170. Accordingly, the performance of the optical sensing apparatus 700a, 700b is improved. The buffer layer 170 may be formed in, for example, any of the optical sensing apparatus 100a, 100b, 200a, 200b, 300a, 300b, 400a, 400b, 500a, or 500b.

Figure 7C:
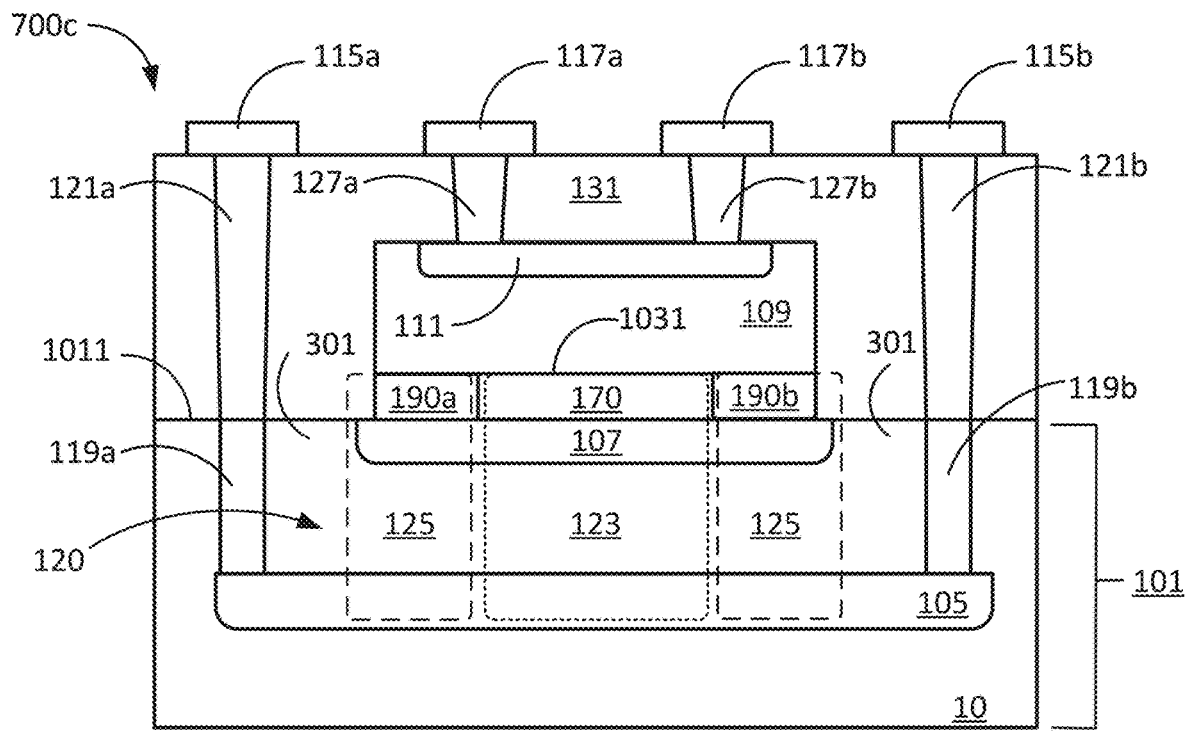
Figure 7D:
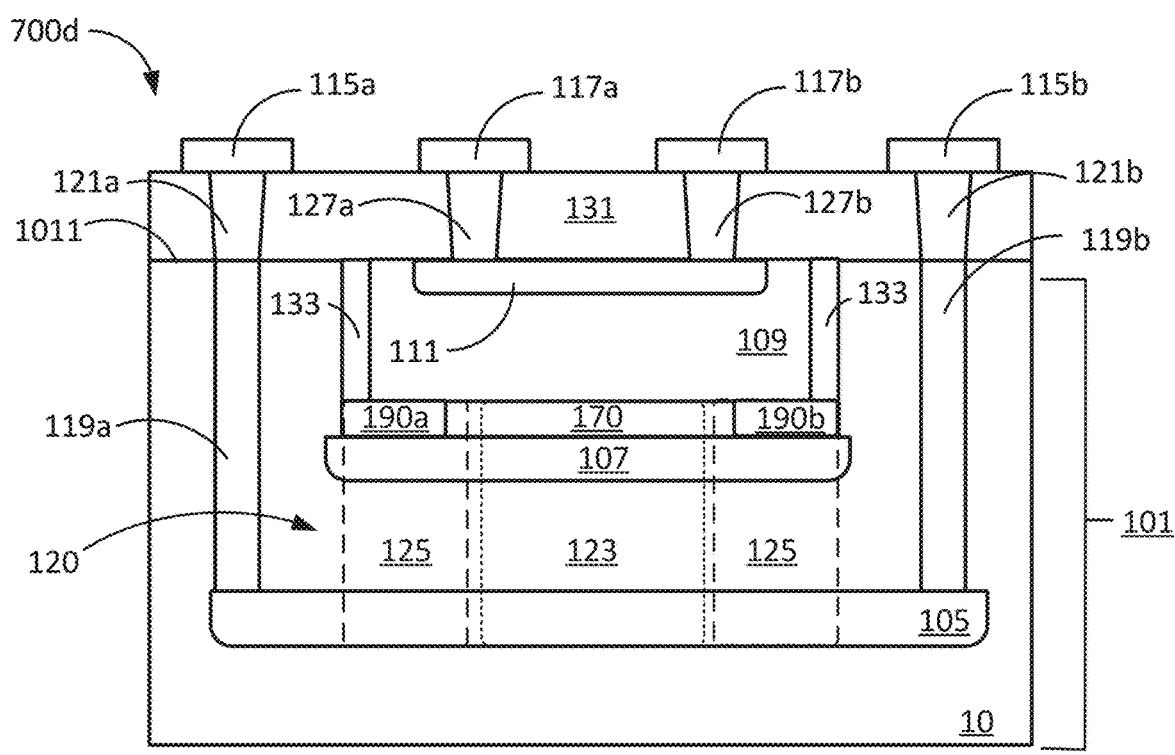
Figure 8A:
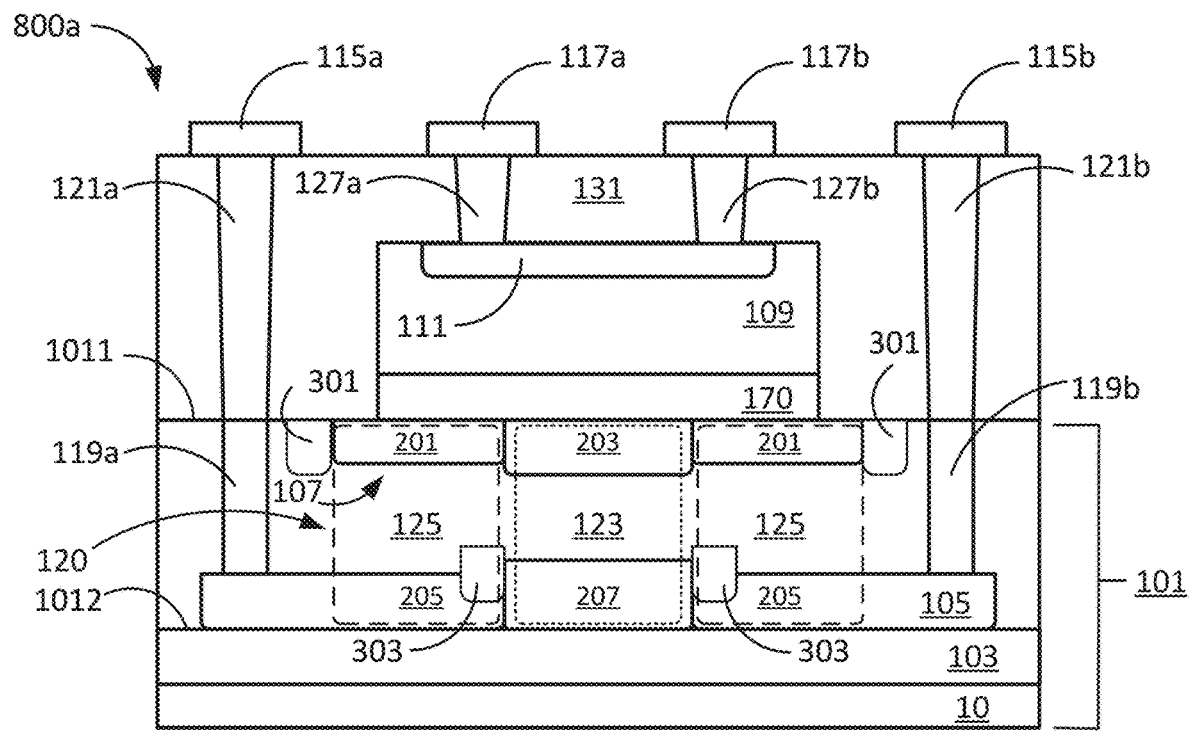
FIGS. 8A-8D illustrate cross-sectional views of an optical sensing apparatus according to one or more embodiments of the present disclosure.
Figure 8B:
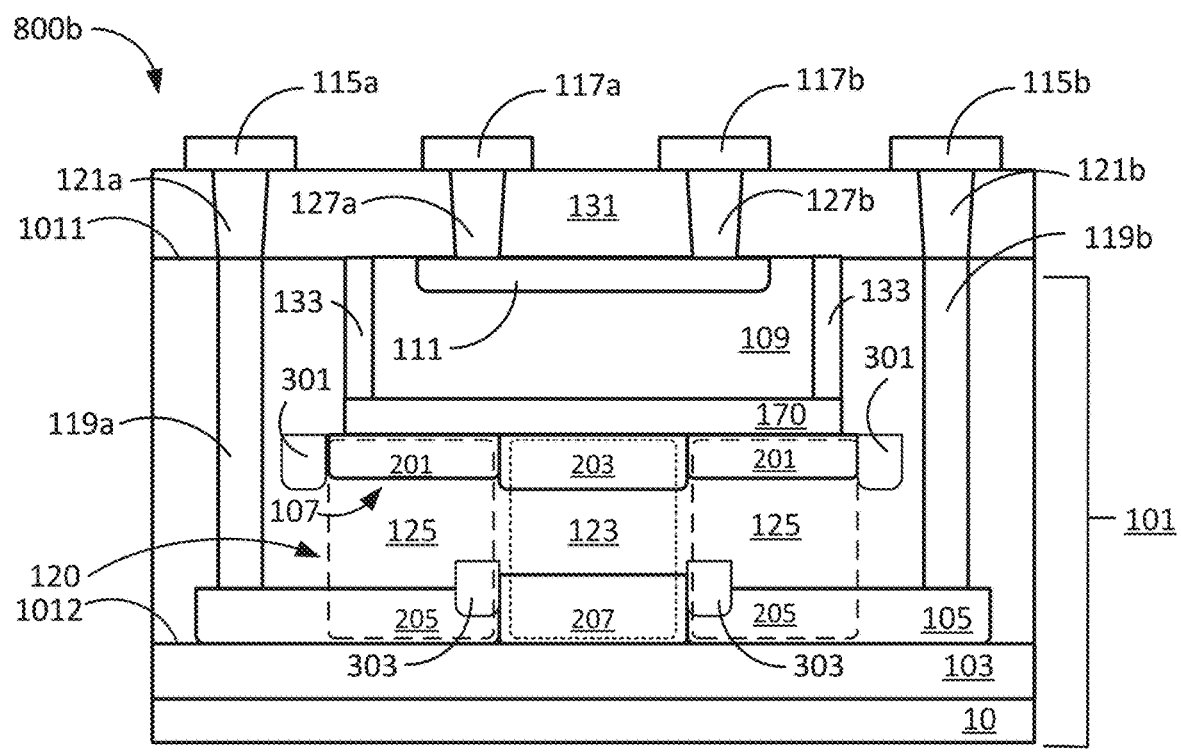
Figure 8C:
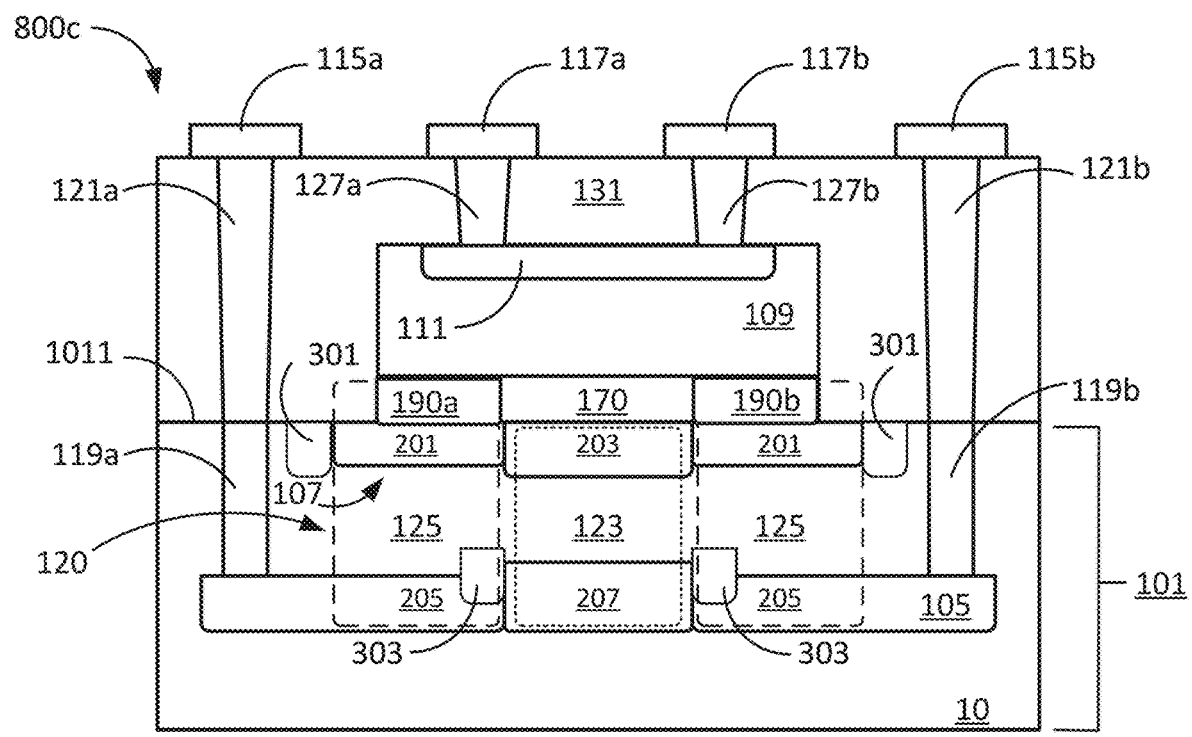
Figure 8D:
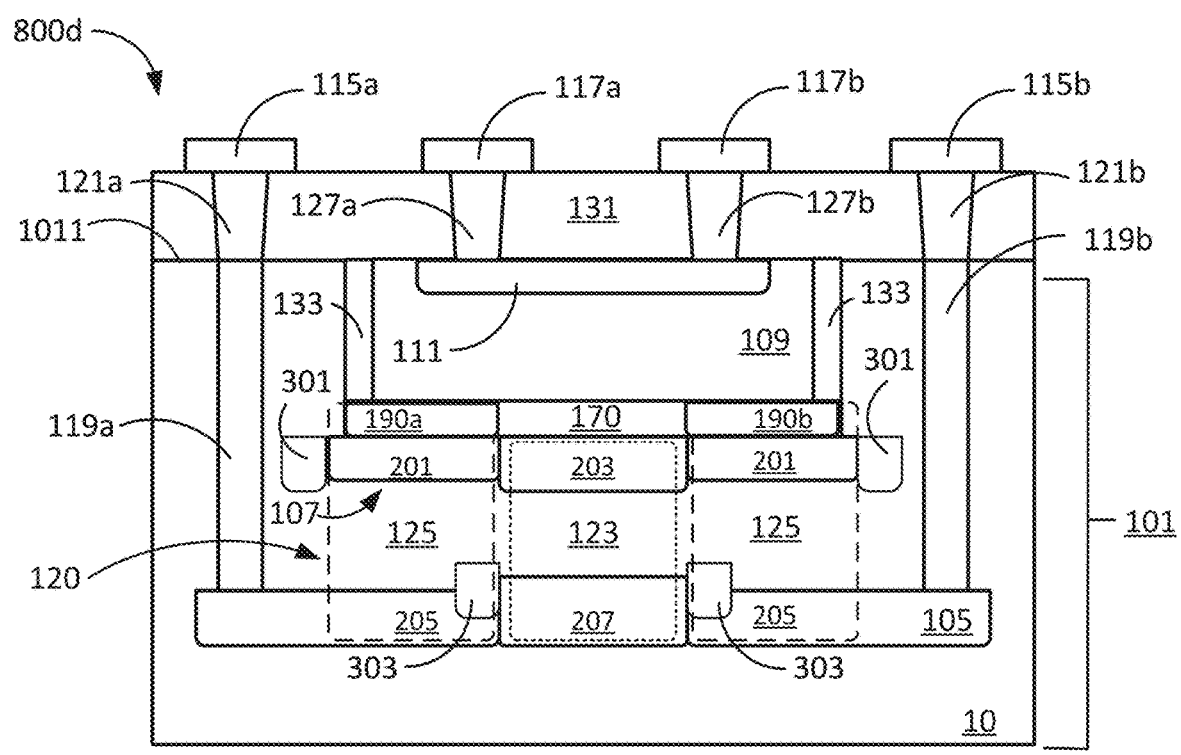

Referring to FIGS. 7C-7D as example optical sensing apparatus 700c/700d, in some implementations, one or more field-control regions 190a and 190b may be formed around the buffer layer 170. Depending on the shape of the buffer layer 170, the field-control regions 190a and 190b may be part of a ring at the edge of the buffer layer 170 that is circular, or the field-control regions 190a and 190b may be of any other suitable shape surrounding the buffer layer 170. The field-control regions 190a and 190b may be of a second conductivity type (e.g., p-type) having a peak doping concentration that is higher than that of the buffer layer 170. In some implementations, by controlling one or more properties (e.g., dopant level, dopant depth, etc.) of the field-control regions 190a and 190b, one or more blocking regions 125 can be formed around one or more punch-through regions 123. For example, a peak doping concentration of the field-control regions 190a and 190b is greater than the peak doping concentration of the buffer layer 170. For another example, a depth of the field-control regions 190a and 190b is deeper than a depth of the buffer layer 170. In some embodiments, the depth of the field-control regions 190a and 190b and the buffer layer 170 is measured by a distance from an interface 1031 (as shown in FIG. 7C between the absorption 109 and the buffer layer 170) to the peak doping concentration.

In some embodiments, the punch-through region(s) 123 has a first break-down voltage similar to a second break-down voltage associated with the one or more blocking regions 125, such that avalanche breakdown similarly begins to occur in the punch-through region(s) 123 and the blocking region(s) 125, while the electrical field in the one or more punch-through regions 123 reaches the absorption region 109 but the electrical field in the one or more blocking regions 125 terminates on the field-control regions 190a and 190b. Accordingly, the one or more punch-through regions 123 collect at least a portion of the photo-carriers from the absorption region 109 and amplify the collected photo-carriers under the first break-down voltage. Besides, the one or more blocking regions 125 may block at least a portion of the photo-carriers so as to guide the portion of the photo-carriers to enter the punch-through region(s) 123.

FIGS. 8A-8D illustrates a cross-sectional view of an optical sensing apparatus 800a/800b/800c/800d according to one or more embodiments of the present disclosure. In some embodiments, the optical sensing apparatus 800a/800b/800c/800d includes the buried-dopant region 105 including the first buried-dopant regions 207 and the second buried-dopant regions 205 as mentioned above. In some embodiments, the optical sensing apparatus 800a/800b/800c/800d includes the interface-dopant region 107 including the first interface-dopant regions 203 and second interface-dopant regions 201 as mentioned above. In some embodiments, the buried-dopant region 105 further includes one or more first doped guard-rings 303 as mentioned above. In some embodiments, the interface-dopant region 107 further includes one or more second doped guard-rings 301 as mentioned above. In some implementations, the optical sensing apparatus 800a/800b/800c/800d includes one or more field-control regions 190a and 190b as mentioned above.

It should be understood that the elements mentioned in the present disclosure can be combined in any manner and in any number to create additional embodiments. For example, the optical sensing apparatus 300a, 400a, 500a, 700a, 800a may also include a passivation layer as mentioned in FIG. 1A. The optical sensing apparatus, e.g., 200a, 200b, 300a, 300b, 400a, 400b, 500a, 500b, 600a,600b, 700a, 700b, 800a, 800b, can also be doped with a graded doping profile of the as described in FIG. 1A through FIG. 1B.

Figure 9:
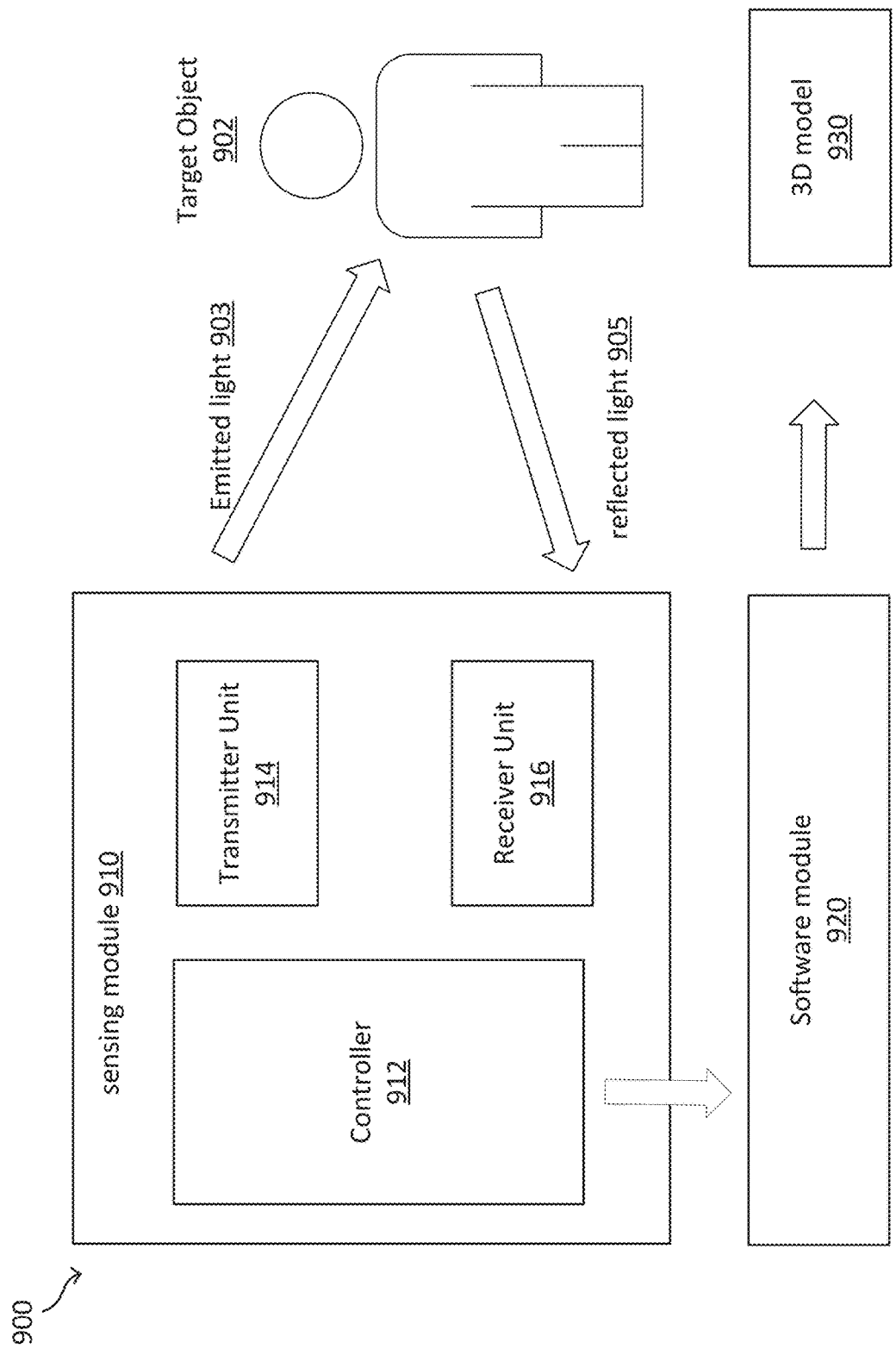
FIG. 9 is a block diagram of an example of a sensing system, according to one or more embodiments of the present disclosure.

FIG. 9 is a block diagram of an example of a sensing system 900. The sensing system 900 may include a sensing module 910 and a software module 920 configured to reconstruct a three-dimensional (3D) model 930 of a detected object. The sensing system 900 or the sensing module 910 may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The sensing module 910 includes a transmitter unit 914, a receiver unit 916, and a controller 912. During operation, the transmitter unit 914 may emit an emitted light 903 toward a target object 902. The receiver unit 916 may receive reflected light 905 reflected from the target object 902. The controller 912 may drive at least the transmitter unit 914 and the receiver unit 916. In some implementations, the receiver unit 916 and the controller 912 are implemented on one semiconductor chip, such as a system-on-a-chip (SoC). In some cases, the transmitter unit 914 is implemented by two different semiconductor chips, such a laser emitter chip on III-V substrate and a Si laser driver chip on Si substrate.

The transmitter unit 914 may include one or more light sources, control circuitry controlling the one or more light sources, and/or optical structures for manipulating the light emitted from the one or more light sources. In some embodiments, the light source may include one or more light emitting diodes (LEDs) or vertical-cavity surface-emitting lasers (VCSELs) emitting light that can be absorbed by the absorption region in the optical sensing apparatus. For example, the one or more LEDs or VCSEL may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structures. For example, the optical structures may include one or more collimating lens.

The receiver unit 916 may include one or more optical sensing apparatus, e.g., 100a, 100b, 200a, 200b, 300a, 300b, 400a, 400b, 500a, 500b, 600a,600b, 700a, 700b, 800a, 800b. The receiver unit 916 may further include a control circuitry for controlling the control circuitry and/or optical structures for manipulating the light reflected from the target object 902 toward the one or more optical sensing apparatus. In some implementations, the optical structures include one or more lens that receive a collimated light and focus the collimated light towards the one or more optical sensing apparatus.

In some embodiments, the controller 912 includes a timing generator (e.g., 1072 in FIG. 10) and a processing unit. The timing generator 1072 receives a reference clock signal and provides timing signals to the transmitter unit 914 for modulating the emitted light 903. The timing signals are also provided to the receiver unit 916 for controlling the collection of the photo-carriers. The processing unit processes the photo-carriers generated and collected by the receiver unit 916 and determines raw data of the target object 902. The processing unit may include control circuitry, one or more signal processors (e.g., 1058 in FIG. 10) for processing the information output from the optical sensing apparatus, and/or computer storage medium that may store instructions for determining the raw data of the target object 902 or store the raw data of the target object 902. As an example, the controller 912 in an i-ToF sensor determines a distance between two points by using the phase difference between light emitted by the transmitter unit 914 and light received by the receiver unit 916.

The software module 920 may be implemented to perform in applications such as facial recognition, eye-tracking, gesture recognition, 3-dimensional model scanning/video recording, motion tracking, autonomous vehicles, and/or augmented/virtual reality.

In some embodiments, the sensing system 900 may be implemented in a lidar system. The sensing system 900 may further include one or more scanning mirror arranged between the route of the one or more optical structures and the target object 902. In some embodiments, the scanning mirror may include micro-electromechanical systems (MEMS) mirror. In some embodiments, the one or more scanning mirror includes multiple scanning mirrors arranged in a one-dimensional or two-dimensional array.

Figure 10:
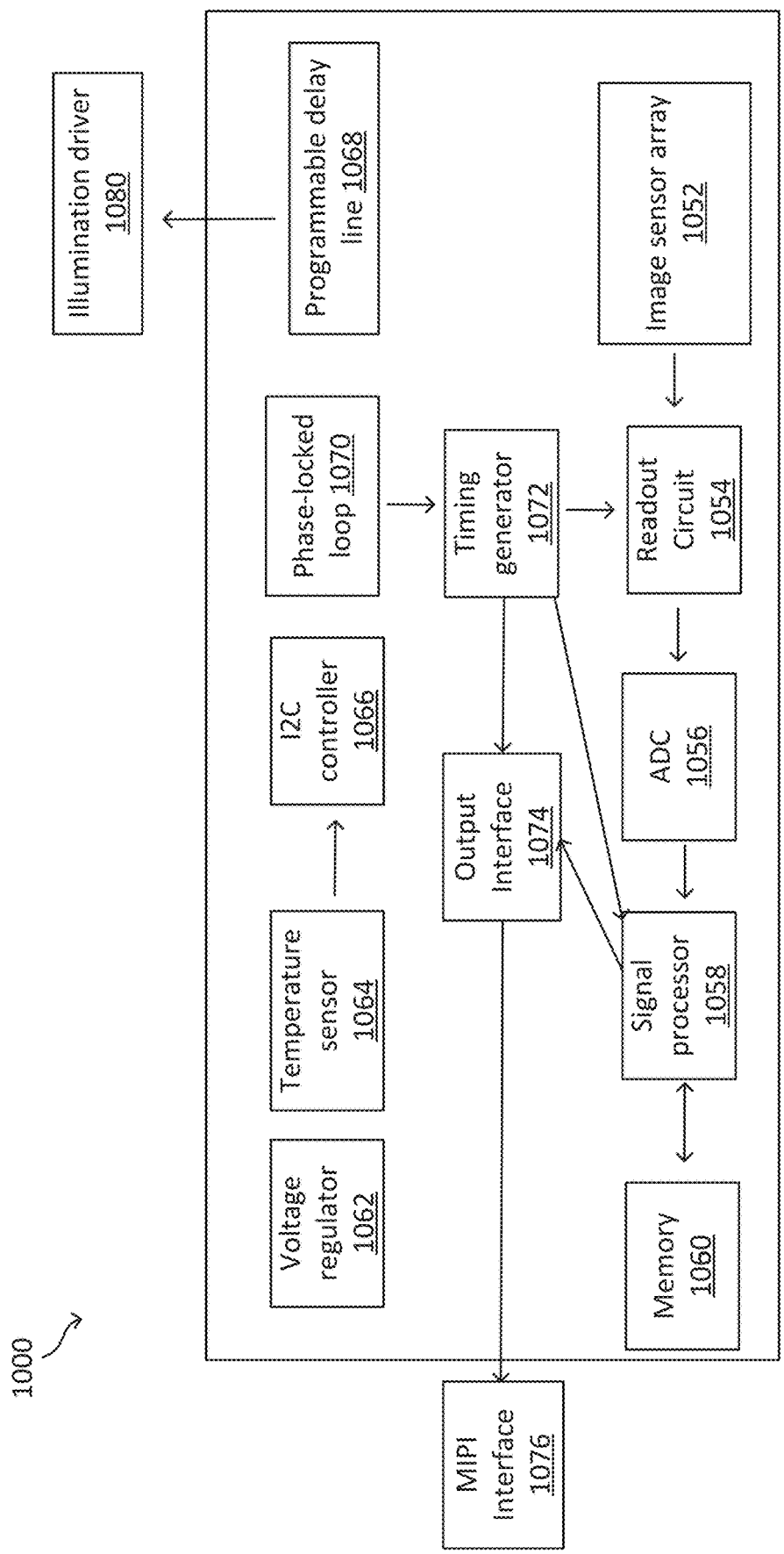
FIG. 10 shows a block diagram of an example receiver unit or a controller, according to one or more embodiments of the present disclosure.

FIG. 10 shows a block diagram of an example device 1000 that can be a receiver unit (e.g., 916) or a controller (e.g., 912). Here, an image sensor array 1052 (e.g., 240× 180-pixel array) may be implemented using any implementations of the optical sensing apparatus described in the present disclosure, e.g., 100a, 100b, 200a, 200b, 300a, 300b, 400a, 400b, 500a, 500b, 600a, 600b, 700a, 700b, 800a, 800b, where the optical sensing apparatus are arranged in one dimensional or two-dimensional array. A phase-locked loop (PLL) circuit 1070 (e.g., an integer-N PLL) may generate a clock signal (e.g., four-phase system clocks) for modulation and demodulation. Before sending to the image sensor array 1052 and an external illumination driver 1080, the clock signal generated by the phase-locked loop (PLL) circuit 1070 may be gated and/or conditioned by a timing generator 1072 for a preset integration time and different operation modes. A programmable delay line 1068 may be added in the illumination driver 1080 path to delay the clock signals.

A voltage regulator 1062 may be used to control an operating voltage of the image sensor array 1052. For example, N voltage domains may be used for an image sensor. A temperature sensor 1064 may be implemented for the possible use of depth calibration and power control, and the inter-integrated circuit (I²C) controller 1066 can access the temperature information from the temperature sensor 1064.

The readout circuit 1054 of the optical sensing apparatus bridges each of the optical sensing apparatus of the image sensor array 1052 to a column analog-to-digital converter (ADC) 1056, where the ADC 1056 outputs may be further processed and integrated in the digital domain by a signal processor 1058 before reaching an output interface 1074 that is coupled to the timing generator 1072. In some embodiments, the readout circuit 1054 may be in a three-transistor configuration including a reset gate, a source-follower, and a selection gate, or in a four-transistor configuration including an additional transfer gate, or any suitable circuitry for processing collected charges.

A memory 1060 may be used to store the outputs by the signal processor 1058. In some implementations, the output interface 1074 may be implemented using a 2-lane, 1.2 Gb/s D-PHY mobile industry processor interface (MIPI) transmitter, or using complementary metal-oxide-semiconductor (CMOS) outputs for low-speed/low-cost systems. The digital data further conditioned by the signal processor 1058 is sent out through an MIPI interface 1076 for further processing.

An inter-integrated circuit (I2C) interface may be used to access all of the functional blocks described here.

In some embodiments, a bandgap of the first material, is greater than a bandgap of the second material of absorption region 109. In some embodiments, the absorption region 109 and/or the substrate 101 includes or is composed of a semiconductor material. In some embodiments, the absorption region 109 and/or the substrate 101 includes or is composed of a Group III-V semiconductor material. The Group III-V semiconductor material may include, but is not limited to, GaAs/AlAs, InP/InGaAs, GaSb/InAs, or InSb. For example, in some embodiments, the absorption region 109 includes or is composed of InGaAs, and the substrate 101 include or is composed of InP. In some embodiments, the absorption region 109 includes or is composed of a semiconductor material including a Group IV element. For example, Ge, Si or Sn. In some embodiments, the absorption region 109 includes or is composed of the $Si_xGe_ySn_{1-x-y}$, where $0 \le x \le 1$, $0 \le y \le 1$, $0 \le x+y \le 1$. In some embodiments, the absorption region 109 includes or is composed of $Ge_{1-a}Sn_a$, where $0 \le a \le 0.1$. In some embodiments, the absorption region 109 includes or is composed of $Ge_xSi_{1-x}$, where $0 \le x \le 1$. In some embodiments, the absorption region 109 composed of intrinsic germanium is of p-type due to material defects formed during formation of the absorption region, where the defect density is from $1 \times 10^{14}$ cm$^{-3}$ to $1 \times 10^{16}$ cm$^{-3}$. In some embodiments, the substrate 101 includes or is composed of the $Si_xGe_ySn_{1-x-y}$, where $0 \le x \le 1$, $0 \le y \le 1$, $0 \le x+y \le 1$. In some embodiments, the substrate 101 includes or is composed of $Ge_{1-a}Sn_a$, where $0 \le a \le 0.1$. In some embodiments, the substrate 101 includes or is composed of $Ge_xSi_{1-x}$, where $0 \le x \le 1$.

In some embodiments, the optical sensing apparatus further includes an optical element (not shown) over the absorption region 109 or substrate 101. In some embodiments, the optical elements include lenses.

During packaging or assembling an optical sensor component (e.g., chip or module that includes any optical sensing apparatus described above) on a system (e.g., printed circuit board), an encapsulation layer such as epoxy may be used to cover the optical component in order to protect the optical component. The optical sensor component may include a micro-lens or a micro-lens array for guiding (e.g., focusing) light onto the sensor(s). The micro-lens may be formed using a polymer-based material, which may have an effective refractive index that is close to the effective refractive index of the encapsulation layer. As the result of the lower refractive index contrast, the designed performance (e.g., focal length) of the micro-lens may suffer. Accordingly, an optical sensing apparatus that addresses such technical issue is disclosed in reference to FIGS. 11A-11E and FIGS. 12A-12E.

Figure 11B:
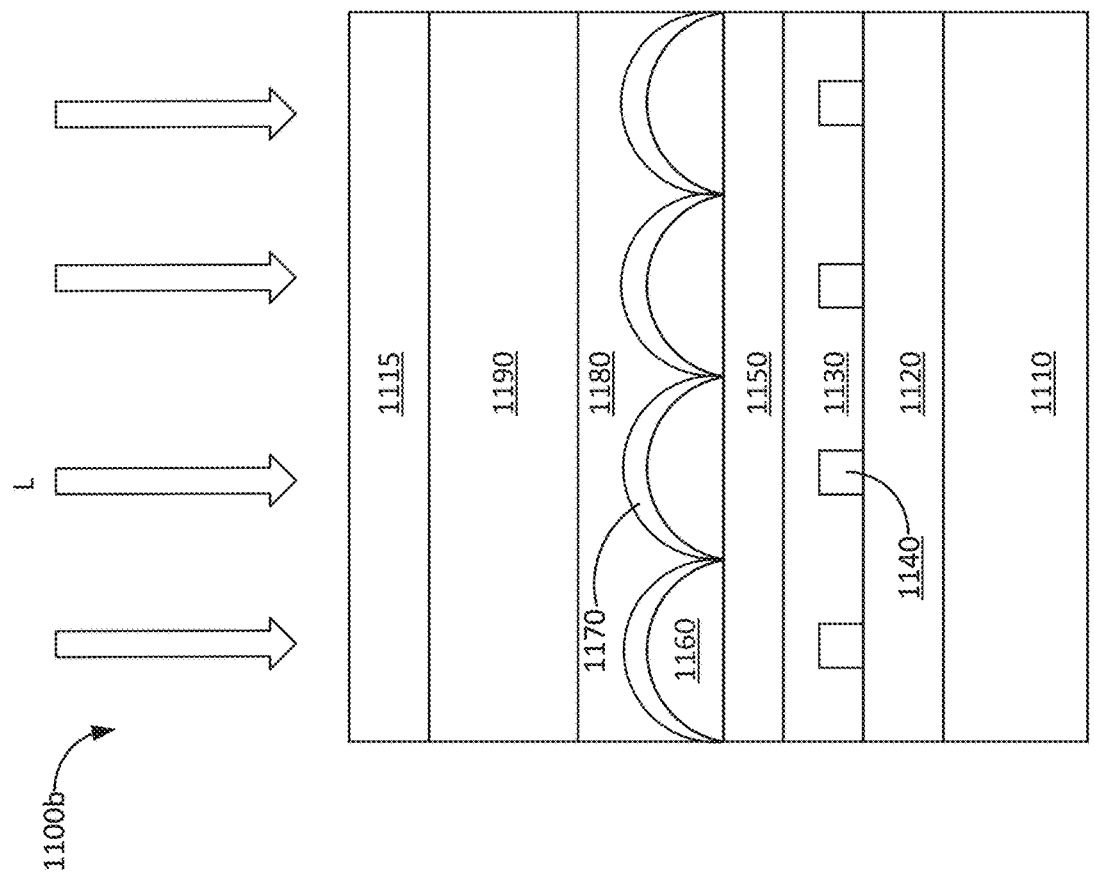
Figure 11A:
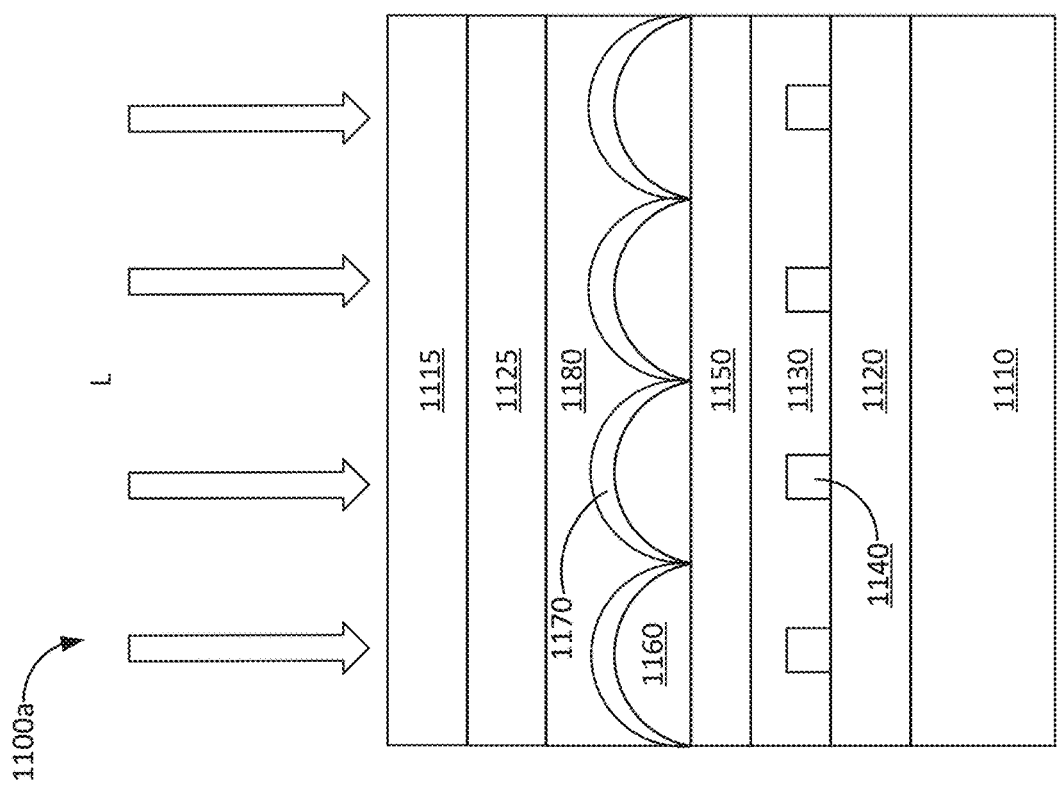

Referring to FIG. 11A, the optical sensing apparatus 1100a includes a substrate 1130 (e.g., Si substrate 10) and one or more pixels 1140 supported by the substrate, where each of the pixel 1140 comprises an absorption region (e.g., Ge absorption region 109) supported by the substrate 1130. A pixel can be any one of optical sensing apparatus described above (e.g., 100a-b, 200a-b, 300a-b, 400a-d, 500a-b, 600a-b, 700a-d, 800a-d, etc.). The absorption region 1140 is configured to receive an optical signal L and generate photo-carriers in response to receiving the optical signal. The optical sensing apparatus 1100a further includes one or more lenses 1160 over the respective pixel of the one or more pixels 1140, where the one or more lenses 1160 are composed of a first material (e.g., Si) having a first refractive index (e.g., ≥3 at the wavelength range absorbed by the absorption region of the one or more pixels 1140 but not absorbed by the lenses 1160). The optical sensing apparatus 1100a further includes an encapsulation layer 1115 over the one or more lenses 1160 and composed of a second material (e.g., polymer) having a second refractive index between 1.3 to 1.8, where a difference between the first refractive index and the second refractive index is above an index threshold such that a difference between an effective focal length of the one or more lenses 1160 and a distance between the one or more lenses 1160 and the one or more pixels 1140 is within a distance threshold (e.g., 1%, 5%, or any other threshold that is tolerable by the system). As a result, the optical signal L can be converged and focused to enter the absorption region of the one or more pixels 1140.

In some embodiments, the first refractive index of the one or more lenses 1160 is not less than 3 (e.g., refractive index of Si is approximately 3.45), where the difference between the first refractive index and the second refractive index of the encapsulation layer 1115 is not less than 0.5, such that optical signal L can be converged and focused to enter the absorption region of the one or more pixels 1140.

In some embodiments, the optical sensing apparatus 1100a further comprises a first planarization layer 1180 between the encapsulation layer 1115 and the one or more lenses 1160, where the first planarization layer 1180 is composed of a third material (e.g., polymer or oxide material such as $Si_xO_y$) having a third refractive index (e.g., between 1 and 2 at the wavelength range absorbed by the absorption region of the one or more pixels 40) that is within a threshold (e.g., 1%, 5%, or any other threshold that is tolerable by the system) from the second refractive index so as to minimize reflection when the optical signal L passes through the interface between the encapsulation layer 1115 and the first planarization layer 1180. In some embodiments, the first planarization layer 1180 provides a substantially flat surface for the subsequent layer (e.g., encapsulation layer 1115, filter layer 1190, second anti-reflection layer 1125 or one or more lenses 1160) to be formed on.

In some embodiments, the optical sensing apparatus 1100a further comprises a first anti-reflection layer 1170 between the one or more lenses 1160 and the first planarization layer 1180, where the first anti-reflection layer 1170 is composed of a fourth material (e.g., oxide material such as $Si_xO_y$, or nitride material such as $Si_xN_y$, or oxynitride material such as $Si_xO_yN_z$) having a fourth refractive index (e.g., between 1 and 2.5 at the wavelength range absorbed by the absorption region of the one or more pixels 1140) between the third refractive index of the first planarization layer 1180 and the first refractive index of the one or more lenses 1160.

In some embodiments, the optical sensing apparatus 1100a further comprises a second planarization layer 1150 between the one or more lenses 1160 and the substrate 1130. The second planarization layer 1150 is configured to provide a substantially flat surface for the subsequent layer (e.g., filter layer 1190 or one or more lenses 1160) to be formed on.

In some embodiments, the first planarization layer 1180 or the second planarization layer 1150 is composed of a material comprising polymer having a refractive index between 1 and 2.

Referring to FIG. 11B, in some embodiments, the optical sensing apparatus 1100b includes a filter layer 1190 between the first planarization layer 1180 and the encapsulation layer 1115, where the filter layer 1190 is configured to pass optical signal having a specific wavelength range (e.g., SWIR range).

Figure 11C:
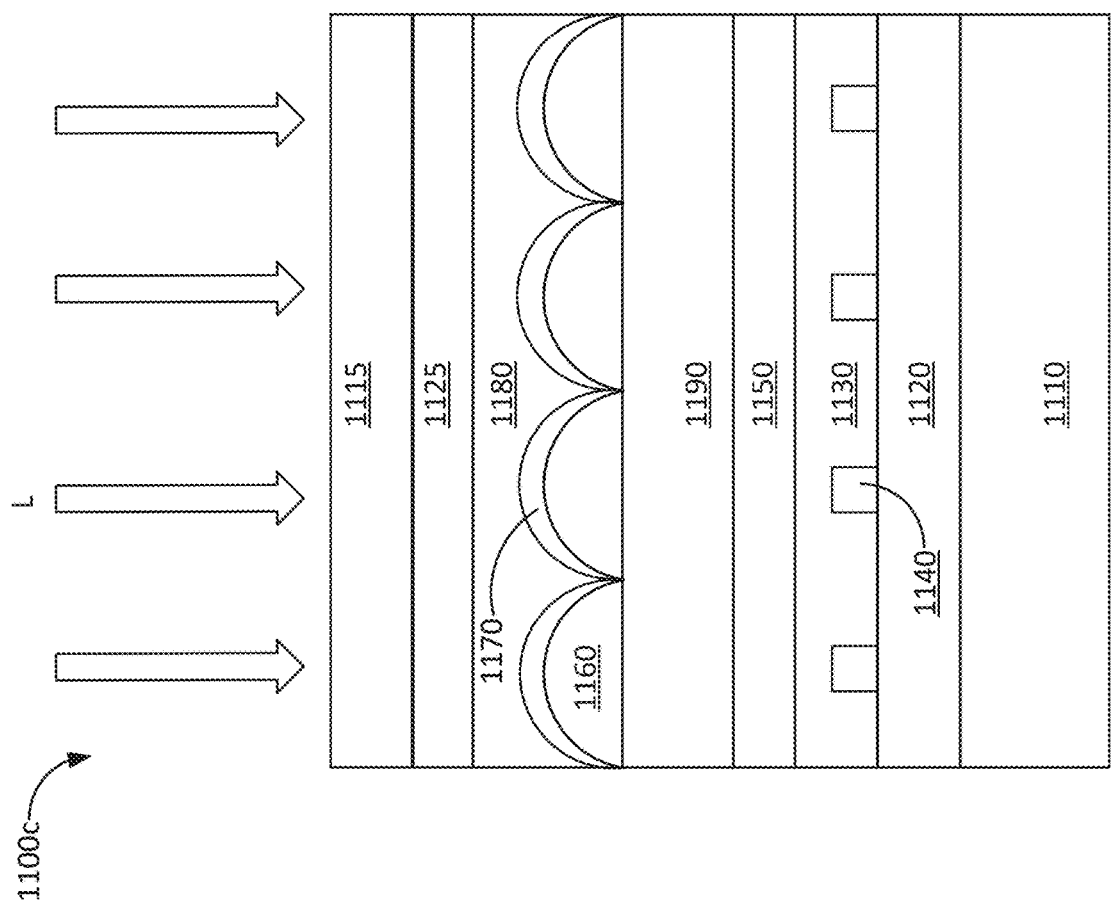

Referring to FIGS. 11A and 11C, in some embodiments, the optical sensing apparatus 1100a/1100c further includes a second anti-reflection layer 1125 between the first planarization layer 1180 and the encapsulation layer 1115, where the second anti-reflection layer 1125 is composed of a sixth material (e.g., polymer or oxide material such as $Si_xO_y$) having a sixth refractive index (between 1 and 2 at the wavelength range absorbed by the absorption region of the one or more pixels 1140) between the second refractive index of the encapsulation layer 1115 and the third refractive index of the first planarization layer 1180. In some embodiments, the sixth material of the second anti-reflection layer 1125 and the third material of the first planarization layer 1180 can be the same. In some embodiments, the sixth refractive index is within a threshold (e.g., 1%, 5%, or any other threshold that is tolerable by the system) from the second refractive index so as to minimize reflection when the optical signal L passes through the interface between the encapsulation layer 1115 and the second anti-reflection layer 1125.

Referring to FIG. 11C, in some embodiments, the optical sensing apparatus 1100c further comprises a filter layer 1190 between the one or more lenses 1160 and the one or more pixels 1140, where the filter layer 1190 is configured to pass optical signal having a specific wavelength range.

In some embodiments, the optical sensing apparatus 1100c further includes a second planarization layer 1150 (e.g., referring to FIG. 11C) between the filter layer 1190 and the substrate 1130.

Figure 11D:
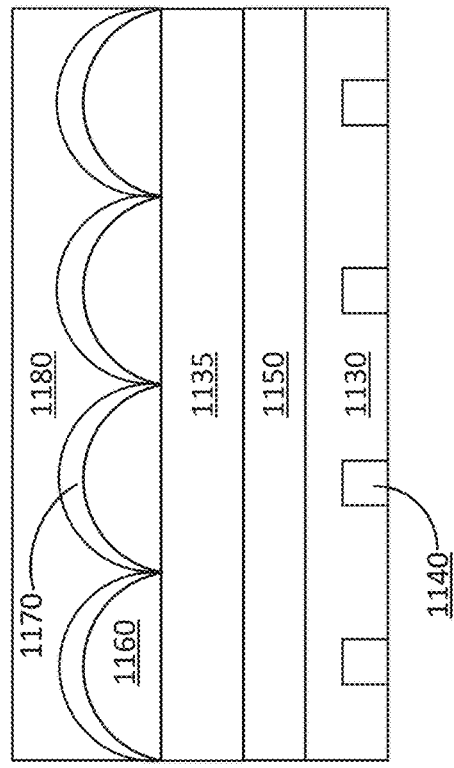
Figure 11E:
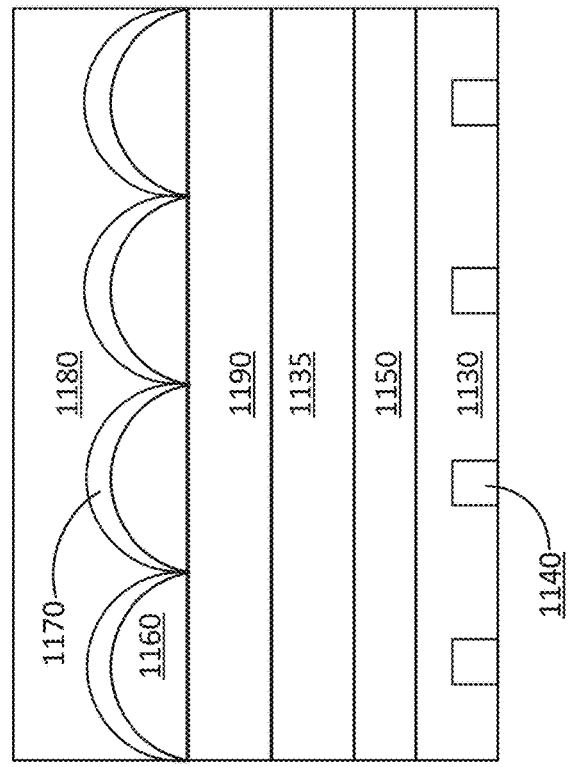

Referring to FIG. 11D and FIG. 11E, in some embodiments, the optical sensing apparatus 1100d/1100e further includes a spacer 1135 between the one or more lenses 1160 and the second planarization layer 1150 (the other layers illustrated in FIGS. 11A-11C may be present but are not shown). The thickness (e.g., less than 10 µm) of the spacer 1135 is configured to provide a path for light to propagate from the one or more lenses 1160 to the one or more pixels 1140, such that a difference between an effective focal length of the one or more lenses 1160 and a distance between the one or more lenses 1160 and the one or more pixels 1140 is within a distance threshold. In some implementations, the spacer 1135 may be composed of a material (e.g., Si, or oxide material such as $Si_xO_y$, or nitride material such as $Si_xN_y$, or oxynitride material such as $Si_xO_yN_z$) having a refractive index (e.g., between 1 and 4 at the wavelength range absorbed by the absorption region of the one or more pixels 40) less than the first refractive index of the one or more lenses 1160. In some implementations, the order of different layers may be different (e.g., the filter layer 1190 may be formed before or after the spacer 1135).

In some embodiments, the optical sensing apparatus 1100a-1100e further comprises a carrier substrate 1110 and an integrated circuit layer 1120 between the one or more pixels 1140 and the carrier substrate 1110, where the integrated circuit layer 1120 comprises a control circuit configured to control the one or more pixels 1140.

In some embodiments, the absorption regions of the one or more pixels 1140 are at least partially embedded in a substrate 1130 (e.g., optical sensing apparatus 100b in FIG. 1B).

In some embodiments, the one or more pixels 1140 are multiple pixels arranged in one-dimensional and two-dimensional array.

In some embodiments, the absorption region includes or is composed of $Ge_xSi_{1-x}$, where $0 \leq x \leq 1$. In some embodiments, the substrate 30 includes or is composed of the $Si_xGe_ySn_{1-x-y}$, where $0 \leq x \leq 1$, $0 \leq y \leq 1$, $0 \leq x+y \leq 1$. In some embodiments, the substrate 1130 includes or is composed of $Ge_{1-a}Sn_a$, where $0 \leq a \leq 0.1$. In some embodiments, the substrate 1130 includes or is composed of $Ge_xSi_{1-x}$, where $0 \leq x \leq 1$. For example, in some embodiments, the absorption region includes or is composed of Ge, and the substrate 1130 include or is composed of Si.

In the present disclosure, if not specifically mention, the absorption region has a thickness depending on the wavelength of photons to be detected and the material of the absorption region. In some embodiments, when the absorption region includes germanium and is designed to absorb photons having a wavelength equal to or greater than 800 nm, the absorption region has a thickness equal to or greater than 0.1 µm. In some embodiments, the absorption region includes germanium and is designed to absorb photons having a wavelength between 700 nm and 2000 nm, the absorption region has a thickness between 0.1 µm and 2.5 µm. In some embodiments, the absorption region has a thickness between 1 µm and 2.5 µm for higher quantum efficiency. In some embodiments, the absorption region may be grown using a blanket epitaxy, a selective epitaxy, or other applicable techniques.

In some implementations, to further improve planarization and/or reduce thickness of the overall device, the optical sensor component may include a metalens array for guiding (e.g., focusing) light onto the pixels 1140. Referring to FIG. 12A as an example, the optical sensing apparatus 1200a shown in FIG. 12A has the same layer arrangement as the optical sensing apparatus 1100a shown in FIG. 11A, where the one or more lenses 1160 are replaced with a metalens array 1260. A metalens of the metalens array 1260 may be formed using 1D or 2D array of surface structures that when combined, acts as an optical element with one or more functions (e.g., a diffractive lens, a filter, etc.). To achieve sufficient index contrast from the encapsulation layer 1115 and any other intermediate layers, the metalens array 1260 may be formed using Si, $Si_xO_y$, $Si_xN_y$, $Si_xO_yN_z$, $Nb_2O_5$, a-Si:H, $TiO_2$, $Ta_2O_5$, ITO, Ag, Nb, or Cr, where $0 \leq x \leq 1$, $0 \leq y \leq 1$, $0 \leq z \leq 1$.

Figure 12B:
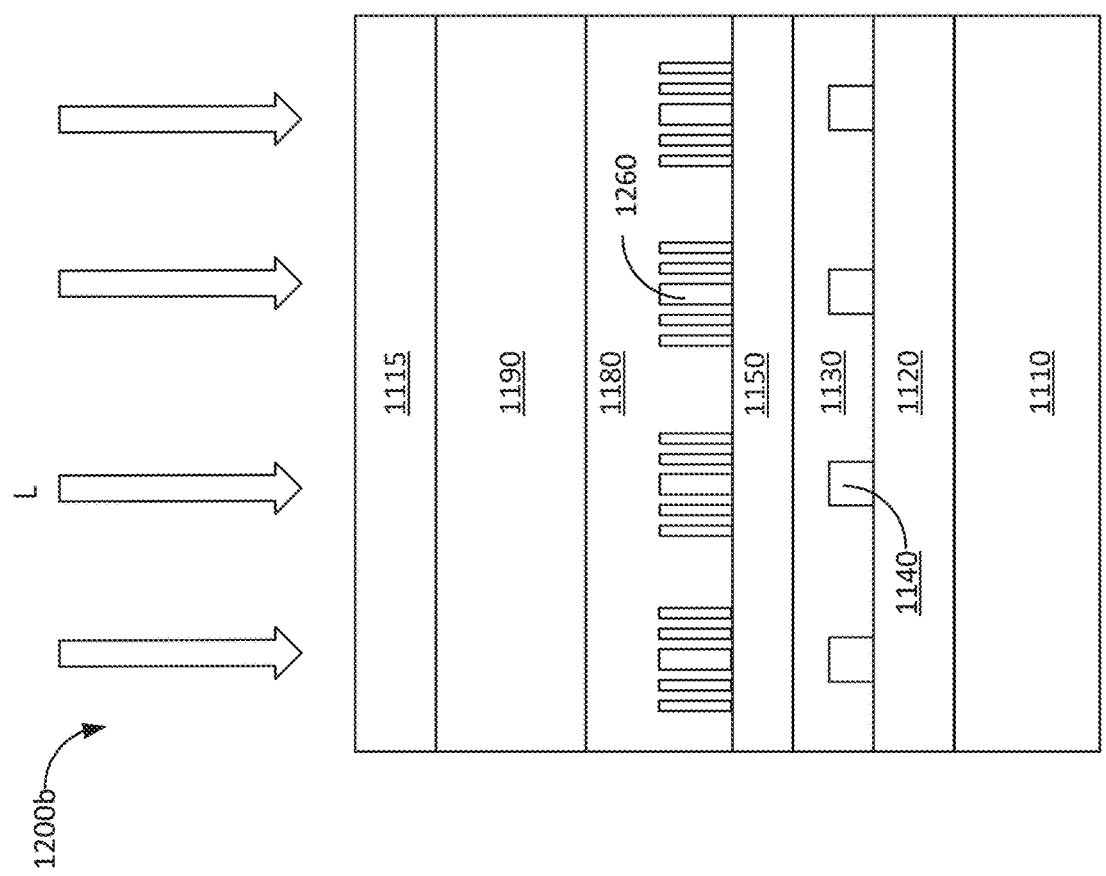
Figure 12A:
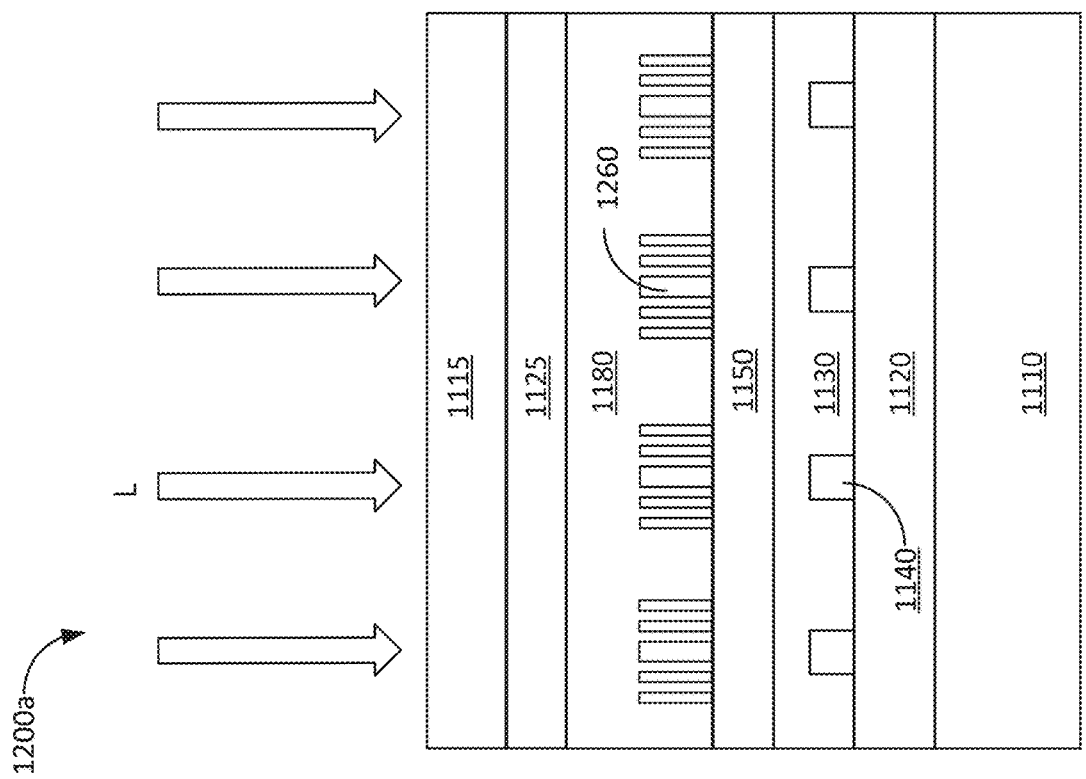

As another example, the optical sensing apparatus 1200b/1200c shown in FIG. 12B and FIG. 12C has the same layer arrangements as the optical sensing apparatus 1100b/1100c shown in FIG. 11B and FIG. 11C, respectively, where the one or more lenses 1160 are replaced with a metalens array 1260. Since the surface structures that form a metalens do not form a curved surface like lens 1160, a better planarization may be achieved with the encapsulation layer 1115. Moreover, a smaller lens may be designed with a metalens, which can increase the density of the overall optical sensor.

Referring to FIG. 12D and FIG. 12E, in some embodiments, the optical sensing apparatus 1200d/1200e further comprises a spacer 1235 between the metalens array 1260 and the second planarization layer 1150 (the other layers illustrated in FIGS. 12A-12C may be present but are not shown). The thickness (e.g., less than 10 µm) of the spacer 1235 is configured to provide a path for light to propagate from the metalens array 1260 to the one or more pixels 1140, such that a difference between an effective focal length of the metalens array 1260 and a distance between the metalens array 1260 and the one or more pixels 1140 is within a distance threshold. In some implementations, the spacer 1235 may be composed of a material (e.g., Si, or oxide material such as $Si_xO_y$, or nitride material such as $Si_xN_y$, or oxynitride material such as $Si_xO_yN_z$) having a refractive index (e.g., between 1 and 4 at the wavelength range absorbed by the absorption region of the one or more pixels 1140) less than the effective refractive index of the metalens array 1260. In some implementations, the order of different layers may be different (e.g., the filter layer 1190 may be formed before or after the spacer 1235).

In some embodiments, the absorption region is configured to absorb photons having a peak wavelength in an invisible wavelength range equal to or greater than 800 nm, such as 850 nm, 940 nm, 1050 nm, 1064 nm, 1310 nm, 1350 nm, or 1550 nm or any suitable wavelength range. In some embodiments, the absorption region receives an optical signal and converts the optical signal into electrical signals. The absorption region can be in any suitable shape, such as, but not limited to, cylinder, or rectangular prism.

In some embodiments, the absorption region 109 has a thickness depending on the wavelength of photons to be detected and the material of the absorption region. In some embodiments, when the absorption region 109 includes germanium and is designed to absorb photons having a wavelength equal to or greater than 800 nm, the absorption region has a thickness equal to or greater than 0.1 µm. In some embodiments, the absorption region 109 includes germanium and is designed to absorb photons having a wavelength between 800 nm and 2000 nm, the absorption region has a thickness between 0.1 µm and 2.5 µm. In some embodiments, the absorption region has a thickness between 1 µm and 2.5 µm for a higher quantum efficiency. In some embodiments, the absorption region may be grown using a blanket epitaxy, a selective epitaxy, or other applicable techniques.

In some embodiments, the term "contact", includes metals or alloys. For example, the first contacts 115a/115b and the second contacts 117a/117b, include Al, Cu, W, Ti, Ta—TaN—Cu stack, or Ti—TiN—W stack.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the inventive concepts have been described by way of examples and in terms of embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical sensing apparatus comprising:
a substrate comprising a first material;
an absorption region comprising a second material different from the first material, the absorption region configured to receive an optical signal and generate photo-carriers in response to receiving the optical signal;
an amplification region formed in the substrate configured to collect at least a portion of the photo-carriers from the absorption region and to amplify the portion of the photo-carriers;
a buried-dopant region formed in the substrate configured to collect at least a portion of the amplified portion of the photo-carriers from the amplification region, wherein the amplification region is between the absorption region and the buried-dopant region; and
an interface-dopant region formed between the absorption region and the buried-dopant region in the substrate,
wherein the buried-dopant region comprises one or more first buried-dopant regions and one or more second buried-dopant regions at least partially surrounding the one or more first buried-dopant regions,
wherein the one or more first buried-dopant regions and the one or more second buried-dopant regions are doped with a dopant having a first conductivity type,
wherein a property associated with the one or more first buried-dopant regions is different from the property associated with the second buried-dopant regions so as to form, under a reverse bias breakdown voltage, one or more punch-through regions and one or more blocking regions in the amplification region, wherein the one or more punch-through regions are adjacent to the one or more first buried-dopant regions and the one or more blocking regions are adjacent to the one or more second buried-dopant regions, and
wherein the property comprises a peak doping concentration or a depth.

2. The optical sensing apparatus of claim 1, wherein the one or more first buried-dopant regions have a first peak doping concentration and a first depth, and the one or more second buried-dopant regions have a second peak doping concentration and a second depth, wherein at least one or more of (i) the second peak doping concentration is lower than the first peak doping concentration, or (ii) the second depth is shallower than the first depth.

3. The optical sensing apparatus of claim 1,
wherein the interface-dopant region is of a second conductivity type different from the first conductivity type, and
wherein the interface-dopant region further comprises:
one or more first interface-dopant regions having a third peak doping concentration and a third depth; and
one or more second interface-dopant regions having a fourth peak doping concentration and a fourth depth, wherein the one or more second interface-dopant regions are at least partially surrounding the one or more first interface-dopant regions,
wherein at least one or more of (i) the fourth peak doping concentration is higher than the third peak doping concentration, or (ii) the fourth depth is shallower than the third depth.

4. The optical sensing apparatus of claim 3, wherein the interface-dopant region further comprises:
one or more doped guard-rings surrounding the one or more second interface-dopant regions.

5. The optical sensing apparatus of claim 1, wherein the absorption region has a gradient doping profile.

6. The optical sensing apparatus of claim 1, wherein the substrate comprises a first interface and a second interface opposite to the first interface, wherein the substrate is substantially devoid of metal material between the first interface and the second interface.

7. A single-photon avalanche detector (SPAD) device comprising:
a silicon substrate including a recess in a first surface of the silicon substrate;
a p-type interface-dopant region arranged in the silicon substrate below a lower surface of the recess;
an n-type avalanche breakdown region arranged in the silicon substrate meeting the p-type interface-dopant region,
an n-type buried-dopant region comprising one or more first buried-dopant regions and one or more second buried-dopant regions at least partially surrounding the one or more first buried-dopant regions; and
a germanium region disposed within the recess,
wherein a property associated with the one or more first buried-dopant regions is different from the property associated with the second buried-dopant regions so as to form, under a reverse bias breakdown voltage, one or more punch-through regions and one or more blocking regions in the n-type avalanche breakdown region, wherein the one or more punch-through regions are adjacent to the one or more first buried-dopant regions and the one or more blocking regions are adjacent to the one or more second buried-dopant regions, and
wherein the property comprises a peak doping concentration or a depth.

8. The SPAD device of claim 7, further comprising sidewall-dopant regions and a buffer layer, wherein the sidewall-dopant regions and the buffer layer are defined where outer sidewalls and a lower surface of the germanium region meet inner sidewalls and a recessed upper surface, respectively, of the silicon substrate.

9. The SPAD device of claim 7,
wherein the n-type buried-dopant region extends laterally from outer edges of the n-type avalanche breakdown region past outer sidewalls of the germanium region; and
wherein the SPAD device further comprises an n-type conductive region extending upwardly from outer edges of the n-type buried dopant region to the first surface of the silicon substrate.

10. The SPAD device of claim 9, wherein the n-type avalanche breakdown region, the n-type buried-dopant region, and the n-type conductive region collectively establish a substantially U-shaped profile that enclose the p-type interface-dopant region and the germanium region.

11. The SPAD device of claim 7, further comprising:
a buffer layer comprising intrinsic silicon disposed between an upper extent of the p-type interface-dopant region and a lower surface of the germanium region.

12. The SPAD device of claim 11, further comprising:
a p-type sidewall-dopant region extending upwards along inner sidewalls of the recess in the silicon substrate and along outer sidewalls of the germanium region.

13. The SPAD device of claim 7, wherein the germanium region has a step-like gradient doping profile where a doping concentration near an upper surface of the germanium region is higher than a doping concentration near a lower surface of the germanium region.

14. The SPAD device of claim 13, further comprising:
a sidewall-dopant region that extends continuously along an outer sidewall of the germanium region.

15. The SPAD device of claim 7, further comprising:
a silicon passivation layer disposed an upper surface of the germanium region.

16. The SPAD device of claim 15, further comprising:
a sidewall-dopant region that is arranged in an outer edge of the recess and that has an upper surface that meets a bottom surface of the silicon passivation layer.

17. A semiconductor structure, comprising:
a semiconductor substrate;
a silicon-based multiplication region formed in the semiconductor substrate;
a germanium-based absorption region formed in the semiconductor substrate, the germanium-based absorption region being located above the silicon-based multiplication region;
a buried-dopant region comprising one or more first buried-dopant regions and one or more second buried-dopant regions at least partially surrounding the one or more first buried-dopant regions; and
a buffer layer between the silicon-based multiplication region and the germanium-based absorption region,
wherein a property associated with the one or more first buried-dopant regions is different from the property associated with the second buried-dopant regions so as to form, under a reverse bias breakdown voltage, one or more punch-through regions and one or more blocking regions in the silicon-based multiplication region, wherein the one or more punch-through regions are adjacent to the one or more first buried-dopant regions and the one or more blocking regions are adjacent to the one or more second buried-dopant regions, and
wherein the property comprises a peak doping concentration or a depth.

18. The semiconductor structure of claim 17, wherein the silicon-based multiplication region comprises:
a p-type region in the semiconductor substrate; and
an n-type avalanche breakdown region in the semiconductor substrate.

19. The semiconductor structure of claim 17, wherein the germanium-based absorption region comprises:
an epitaxial bulk germanium region buried in the semiconductor substrate; and
a p-type sidewall-dopant region extending along outer edges of the epitaxial bulk germanium region and separating epitaxial bulk germanium region from the semiconductor substrate.

* * * * *